US010150293B2

(12) United States Patent
Machida et al.

(10) Patent No.: US 10,150,293 B2
(45) Date of Patent: Dec. 11, 2018

(54) ELECTROMECHANICAL TRANSDUCER ELEMENT, METHOD FOR PRODUCING ELECTROMECHANICAL TRANSDUCER ELEMENT, LIQUID EJECTING HEAD, LIQUID EJECTING UNIT, AND APPARATUS FOR EJECTING LIQUID

(71) Applicants: Osamu Machida, Kanagawa (JP); Masahiro Ishimori, Tokyo (JP); Atsushi Takeuchi, Kanagawa (JP); Shuya Abe, Kanagawa (JP)

(72) Inventors: Osamu Machida, Kanagawa (JP); Masahiro Ishimori, Tokyo (JP); Atsushi Takeuchi, Kanagawa (JP); Shuya Abe, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/405,714

(22) Filed: Jan. 13, 2017

(65) Prior Publication Data

US 2017/0210132 A1   Jul. 27, 2017

(30) Foreign Application Priority Data

Jan. 22, 2016   (JP) ................................ 2016-011087

(51) Int. Cl.
*B41J 2/14* (2006.01)
*H01L 41/08* (2006.01)
(Continued)

(52) U.S. Cl.
CPC ......... *B41J 2/14233* (2013.01); *B41J 2/1612* (2013.01); *B41J 2/1629* (2013.01);
(Continued)

(58) Field of Classification Search
CPC .... B41J 2/14233; B41J 2/1646; B41J 2/1645; B41J 2/1631; B41J 2/1629; B41J 2/1612;
(Continued)

(56) References Cited

U.S. PATENT DOCUMENTS 7,726,783 B2   6/2010   Nihei
8,425,026 B2   4/2013   Machida et al.
(Continued)

FOREIGN PATENT DOCUMENTS

JP   2008-260269   10/2008
JP   2013-146657   8/2013
JP   2014-183154   9/2014

*Primary Examiner* — Sharon A Polk
(74) *Attorney, Agent, or Firm* — IPUSA, PLLC

(57) ABSTRACT

An electromechanical transducer element includes a first electrode; an electromechanical transducer film stacked on one surface of the first electrode; a second electrode stacked on the electromechanical transducer film; and wiring formed on the second electrode. In an at least one cross section, each of a boundary, on a second electrode side, of the electromechanical transducer film and a boundary, on a side opposite to the electromechanical transducer film, of the second electrode is a curved shape protruding away from the first electrode. In the at least one cross section, each of a film thickness of the electromechanical transducer film and a film thickness of the second electrode becomes thinner toward end portions from a maximum height portion.

13 Claims, 19 Drawing Sheets

(51) Int. Cl.
    *H01L 41/09*     (2006.01)
    *H01L 41/29*     (2013.01)
    *H01L 41/331*    (2013.01)
    *B41J 2/16*      (2006.01)

(52) U.S. Cl.
    CPC ........... *B41J 2/1631* (2013.01); *B41J 2/1645* (2013.01); *B41J 2/1646* (2013.01); *H01L 41/0805* (2013.01); *H01L 41/098* (2013.01); *H01L 41/29* (2013.01); *H01L 41/331* (2013.01)

(58) Field of Classification Search
    CPC ..... H01L 41/331; H01L 41/29; H01L 41/098; H01L 41/0805
    See application file for complete search history.

(56) References Cited

U.S. PATENT DOCUMENTS

| | | | |
|---|---|---|---|
| 8,646,180 B2 | 2/2014 | Akiyama et al. | |
| 8,713,768 B2 | 5/2014 | Watanabe et al. | |
| 8,733,906 B2 | 5/2014 | Mizukami et al. | |
| 8,770,725 B2 | 7/2014 | Watanabe et al. | |
| 8,833,921 B2 | 9/2014 | Kihira et al. | |
| 8,888,253 B2 | 11/2014 | Machida et al. | |
| 8,911,063 B2 | 12/2014 | Watanabe et al. | |
| 8,926,069 B2 | 1/2015 | Ishimori et al. | |
| 8,960,866 B2 | 2/2015 | Machida et al. | |
| 8,960,867 B2 | 2/2015 | Ishimori et al. | |
| 9,056,454 B2 | 6/2015 | Machida et al. | |
| 9,196,821 B2 | 11/2015 | Aoyama et al. | |
| 9,202,717 B2 | 12/2015 | Takeuchi et al. | |
| 9,401,471 B2 | 7/2016 | Mizukami et al. | |
| 2012/0256520 A1* | 10/2012 | Torashima | H01L 41/0815 310/300 |
| 2013/0050346 A1 | 2/2013 | Takeuchi et al. | |
| 2014/0049582 A1 | 2/2014 | Machida et al. | |
| 2014/0267509 A1 | 9/2014 | Shinkai et al. | |
| 2014/0288219 A1 | 9/2014 | Doi et al. | |
| 2014/0375728 A1* | 12/2014 | Machida | B41J 2/045 347/68 |
| 2015/0070444 A1 | 3/2015 | Ishimori et al. | |
| 2016/0049579 A1 | 2/2016 | Shimofuku et al. | |

* cited by examiner

FIG.14

| WIDTH Wp [μm] | FILM FORMATION QUALITY DETERMINATION | CROSS-SECTIONAL SHAPE IMAGE |
|---|---|---|
| 10 | NG | PROTRUSION |
| 15 | NG | PROTRUSION |
| 20 | OK | |
| 25 | OK | |
| 30 | OK | |
| 50 | OK | |
| 100 | OK | |
| 200 | OK | |
| 300 | OK | |
| 400 | OK | |
| 500 | OK | |
| 600 | NG | |
| 700 | NG | |

ELECTROMECHANICAL TRANSDUCER ELEMENT, METHOD FOR PRODUCING ELECTROMECHANICAL TRANSDUCER ELEMENT, LIQUID EJECTING HEAD, LIQUID EJECTING UNIT, AND APPARATUS FOR EJECTING LIQUID

CROSS-REFERENCE TO RELATED APPLICATIONS

The present application claims priority under 35 U.S.C. § 119 to Japanese Patent Application No. 2016-011087 filed on Jan. 22, 2016, the contents of which are incorporated herein by reference in their entirety.

BACKGROUND OF THE INVENTION

1. Field of the Invention

The disclosures herein generally relate to an electromechanical transducer element, a method for producing an electromechanical transducer element, liquid ejecting head, a liquid ejecting unit, and an apparatus for ejecting liquid.

2. Description of the Related Art

A Chemical Solution Deposition (CSD) method is known in the related art as a method for forming an electromechanical transducer film that is a ferroelectric film used as a piezoelectric actuator. The CSD method may be referred to as a sol-gel method. According to the CSD method, for example, a process of forming an application film of a precursor solution of the electromechanical transducer film on a lower electrode and a process of applying a heating treatment to crystallize the film are repeated for a predetermined number of times to form the film.

After that, a pattern of the crystallized electromechanical transducer film is formed by photolithography and etching. Further, a metal film is formed on the electromechanical transducer film by a sputtering method and a pattern of an upper electrode is formed by photolithography and etching to form the electromechanical transducer film (see Japanese Unexamined Patent Application Publication No. 2008-260269, for example).

SUMMARY OF THE INVENTION

It is a general object of at least one embodiment of the present disclosure to provide an electromechanical transducer element, a method for producing an electromechanical transducer element, a liquid ejecting head, a liquid ejecting unit, and an apparatus for ejecting liquid that substantially obviate one or more problems caused by the limitations and disadvantages of the related art.

According to one aspect of the present disclosure, there is provided an electromechanical transducer element including a first electrode; an electromechanical transducer film stacked on one surface of the first electrode; a second electrode stacked on the electromechanical transducer film; and wiring formed on the second electrode. In an at least one cross section, each of a boundary, on a second electrode side, of the electromechanical transducer film and a boundary, on a side opposite to the electromechanical transducer film, of the second electrode is a curved shape protruding away from the first electrode. In the at least one cross section, each of a film thickness of the electromechanical transducer film and a film thickness of the second electrode becomes thinner toward end portions from a maximum height portion.

BRIEF DESCRIPTION OF THE DRAWINGS

FIG. 14 is a table illustrating a result obtained in working example 4;

DESCRIPTION OF THE PREFERRED EMBODIMENTS

Figure 1:
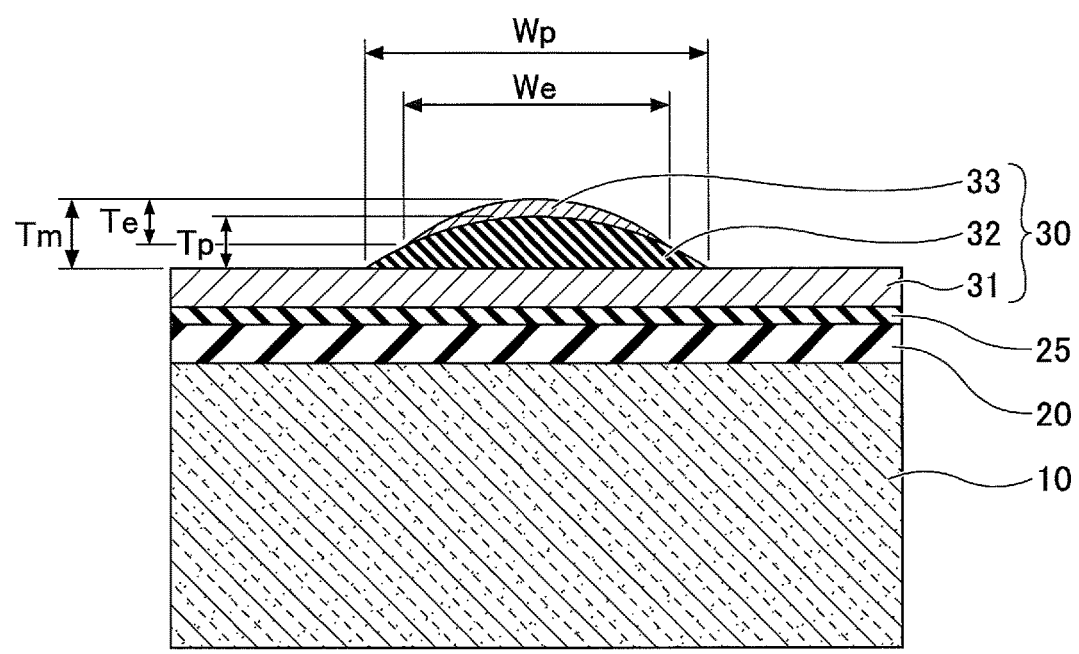
FIG. 1 is a cross-sectional view illustrating an example of an electromechanical transducer element according to a first embodiment.

In the following, embodiments of the present disclosure will be described with reference to the accompanying drawings. One embodiment of the present disclosure has an object to provide an electromechanical transducer element that can improve connection reliability of the wiring.

Hereinafter, embodiments for implementing the present disclosure will be described with reference to the accompanying drawings. In the drawings, identical reference numerals may be given to identical elements, and thereby overlapped descriptions may be omitted as appropriate.

First Embodiment

FIG. 1 is a cross-sectional view illustrating an example of an electromechanical transducer element 30 according to a first embodiment. As illustrated in FIG. 1, a vibrating plate (oscillation plate) 20 is formed on a substrate 10, and the electromechanical transducer element 30 is formed on the vibrating plate 20 via an adhesive layer 25. The electromechanical transducer element 30 includes a lower electrode 31, an electromechanical transducer film 32, and an upper electrode 33. The electromechanical transducer film 32 and the upper electrode 33 are sequentially stacked on one surface of the lower electrode 31. Here, the lower electrode 31 is a typical example of a first electrode according to the embodiment of the present disclosure. The upper electrode 33 is a typical example of a second electrode according to the embodiment of the present disclosure.

For example, a silicon substrate or the like may be used as the substrate 10. A thickness of the substrate 10 may be in a range of from about 100 µm to about 600 µm, for example.

For example, aluminum oxide, zirconium oxide, iridium oxide, ruthenium oxide, tantalum oxide, hafnium oxide, osmium oxide, rhenium oxide, rhodium oxide, palladium oxide, and a chemical compound of the above-described oxides may be used as a material of the vibrating plate 20. A film thickness of the vibrating plate 20 may be in a range of from about 1 µm to about 3 µm, for example.

For example, Ti, $TiO_2$, Ta, $Ta_2O_5$, $Ta_3N_5$, or the like may be used as a material of the adhesive layer 25. For example, metal such as platinum (Pt), gold (Au), or silver (Ag) may be used as a material of the lower electrode 31. A conductive oxide such as LNO (Lanthanum nickelate, $LaNiO_3$) or SRO (strontium ruthenate, $SrRuO_3$) may be stacked on the metal. A film thickness of the lower electrode 31 may be in a range of from about 0.05 µm to about 1 µm, for example.

It is preferable to use lead zirconate titanate (PZT) as a material of the electromechanical transducer film 32. The PZT is a solid solution of lead zirconate ($PbZrO_3$) and lead titanate ($PbTiO_3$), and a property of PZT varies depending on a ratio between $PbZrO_3$ and $PbTiO_3$. For example, a specific PZT can be used whose ratio of $PbZrO_3$ to $PbTiO_3$ is 53 to 47. Such a specific PZT may be represented by a chemical formula of $P_b(Zr_{0.53}, Ti_{0.47})O_3$. More generally, the specific PZT may be denoted by PZT (53/47).

For example, metal such as platinum (Pt), gold (Au), or silver (Ag) may be used as a material of the upper electrode 33. A conductive oxide such as LNO (lanthanum nickelate, $LaNiO_3$) or SRO (strontium ruthenate, $SrRuO_3$) may be stacked on the metal. A film thickness of the upper electrode 33 may be in a range of from about 0.05 µm to about 1 µm, for example.

The electromechanical transducer film 32 and the upper electrode 33 in the electromechanical transducer element 30 are formed by an ink jet method. Differing from a configuration formed by a spin coating method, because a pattern is formed in a liquid state, the electromechanical transducer film 32 and the upper electrode 33, formed by the ink jet method, have a protruding curved shape (cylindrical shape) in the cross section due to surface tension of the liquid solution when being dried. Further, because a cross-sectional shape of the electromechanical transducer film 32 and the upper electrode 33 formed by the ink jet method is determined according to the surface tension of liquid, the reproducibility of the shape is excellent.

In at least one cross section of the electromechanical transducer film 32, a film thickness distribution shape of the electromechanical transducer film 32 can be approximated by a formula 1: $y = -ax^2 + b$ where a and b are constants. In other words, the boundary, on the upper electrode 33 side, of the electromechanical transducer film 32 is approximated by the formula 1: $y = -ax^2 + b$.

Here, in a case where a planar shape of the electromechanical transducer film 32 is a circle, the at least one cross section of the electromechanical transducer film 32 is a longitudinal section passing through a center of the circle. In a case where a planar shape of the electromechanical transducer film 32 has a long and thin portion of a constant width, the at least one cross section of the electromechanical transducer film 32 is a vertical section in a short direction of the long and thin portion of the constant width. In the following, the at least one cross section of the electromechanical transducer film 32 may be referred to as the cross section.

The film thickness distribution shape indicates a shape of an upper side in the cross section and a shape of a lower side is not limited. For example, in the electromechanical transducer film 32, the film thickness distribution shape that is a shape of the upper side of the electromechanical transducer film 32, which is a side on the upper electrode 33 side, may be approximated by the formula 1, but a shape of the lower side of the electromechanical transducer film 32 is a substantially straight line.

In the above formula 1, x represents a coordinate position in a direction perpendicular to the film thickness direction of the electromechanical transducer film 32, when a center of a width Wp of the electromechanical transducer film 32 in the cross section is defined as x=0. Further, in the formula 1, y, which is a function of x, represents a height from an end portion of the electromechanical transducer film 32. Further, when the maximum height of the electromechanical transducer film 32 from the end portion of the electromechanical transducer film 32 in the cross section is Tp, formulas of $a = (4Tp)/Wp^2$ and $b = Tp$ are satisfied in a case where the height of the electromechanical transducer film 32 is maximum when X=0.

Similar to the electromechanical transducer film 32, the cross-sectional shape of the upper electrode 33 is determined according to the surface tension of the upper electrode 33, and the film thickness distribution shape that is a shape of an upper side of the upper electrode 33, which is a side opposite to the electromechanical transducer film 32 side, may be approximated by a formula 2: $y=-cx^2+d$ in the cross section where c and d are constants. In other words, the boundary, on the side opposite to the electromechanical transducer film 32, of the upper electrode 33 is approximated by the formula 2: $y=-cx^2+d$. In the formula 2, x represents a coordinate position in a direction perpendicular to the film thickness direction of the upper electrode 33, when a center of the width Wp of the electromechanical transducer film 32 in the cross section is defined as x=0. Further, in the formula 2, y, which is a function of x, represents a height from an end portion of the upper electrode 33.

As described above, in the cross section as illustrated in FIG. 1, each of a boundary, on the upper electrode 33 side, of the electromechanical transducer film 32 and a boundary, on the side opposite to the electromechanical transducer film 32, of the upper electrode 33 is a curved shape protruding away from the lower electrode 31. In the cross section, each of a film thickness of the electromechanical transducer film 32 and a film thickness of the upper electrode 33 becomes thinner toward end portions from a maximum height portion.

Further, when a width of the upper electrode 33 in the cross section is We, and the maximum height of the upper electrode 33 from the end portion of the upper electrode 33 in the cross section is Te, formulas of $c=(4Te)/We^2$ and $b=Te$ are satisfied in a case where the height of the upper electrode 33 is maximum when X=0. In FIG. 1, Tm represents the maximum height of the upper electrode 33 from the end portion of the electromechanical transducer film 32 in the cross section.

Figure 2:
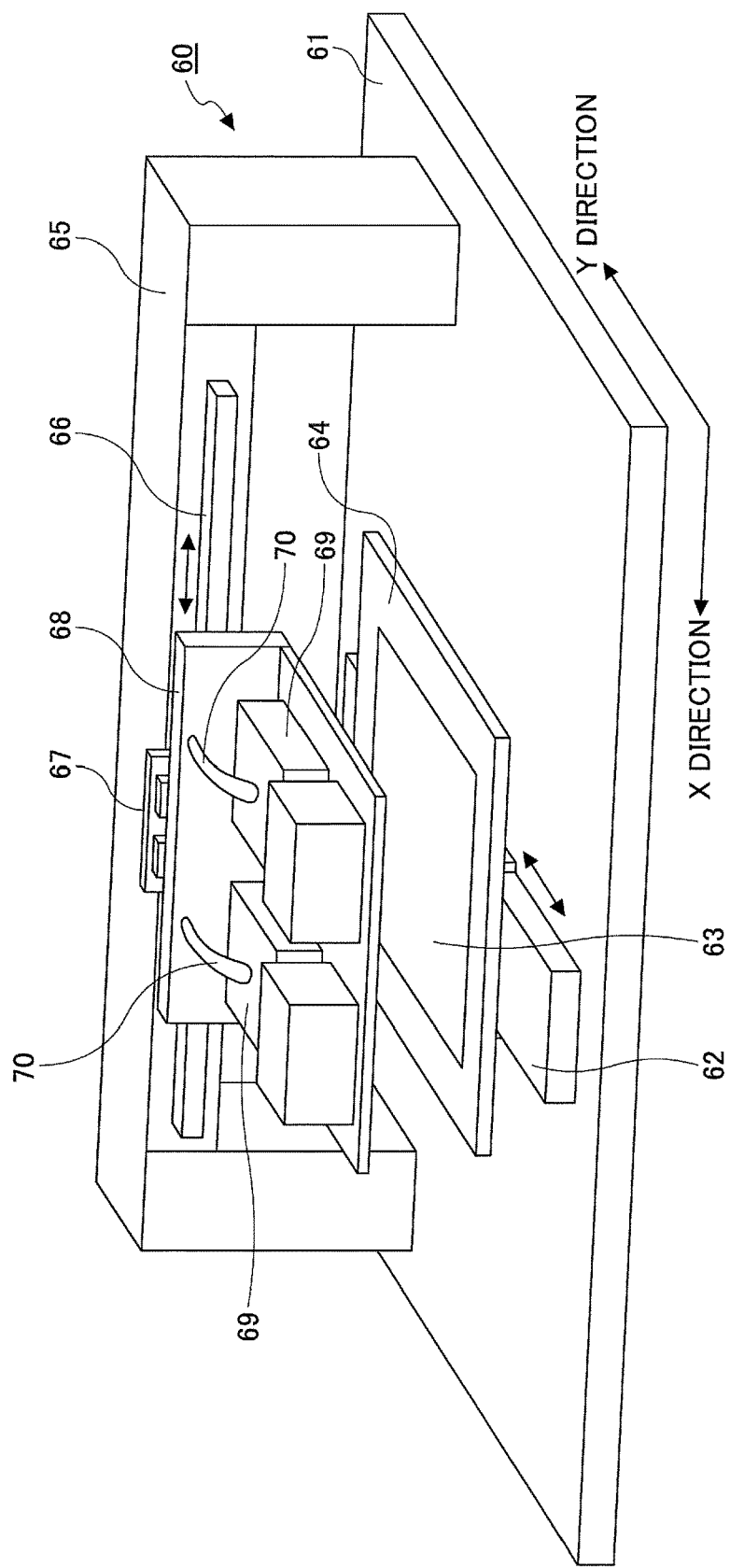
FIG. 2 is a perspective view illustrating an example of an ink jet applying apparatus according to the first embodiment.

FIG. 2 is a perspective view illustrating an example of an ink jet applying apparatus 60. In the ink jet applying apparatus 60 illustrated in FIG. 2, a Y-axis driving unit 62 is mounted on a base plate 61. Further, on the Y-axis driving unit 62, there is mounted a stage 64 on which a substrate 63 is mounted. The stage 64 is installed so as to be driven in the Y-axis direction. The stage 64 includes an attracting unit that uses vacuum or static electricity, for example, and the substrate 63 is fixed to the stage 64.

Further, an X-axis driving unit 66 is attached to an X-axis supporting member 65. A Z-axis driving unit 67 is mounted on the X-axis driving unit 66. A head base 68 is mounted on the Z-axis driving unit 67 so as to be moved in the X-axis direction. Ink jet heads 69 that eject ink are mounted on the head base 68. Further, via pipes 70 for supplying colored resin ink, inks are supplied to the ink jet heads 69 from ink tanks, respectively. The ink jet applying apparatus 60 may include an alignment camera for positioning.

FIGS. 3 to 7 are diagrams illustrating an example of steps of producing an electromechanical transducer film according to the first embodiment. Each of FIGS. 3 to 7 illustrates a cross section corresponding to the cross section of FIG. 1. Here, an example of forming the electromechanical transducer element 30 using the PZT film as the electromechanical transducer film 32 will be described, for example.

Figure 3A:
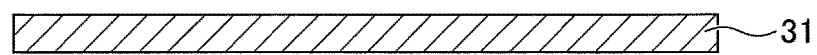
FIGS. 3A to 3C are diagrams (part 1) illustrating an example of processes of producing the electromechanical transducer element according to the first embodiment.

First, in a process illustrated in FIG. 3A, the vibrating plate 20, the adhesive layer 25, and the lower electrode 31 are sequentially stacked on the substrate 10. It should be noted that only the lower electrode 31 is illustrated in FIGS. 3 to 7. The vibrating plate 20 can be formed by a sputtering method, a sol-gel method, or the like, for example. For example, the adhesive layer 25 can be formed by a vacuum film forming method such as the sputtering method or a vacuum deposition method. For example, the lower electrode 31 can be formed by a vacuum film forming method such as the sputtering method or the vacuum deposition method. The materials and the film thicknesses of the respective components are described above.

Figure 3B:
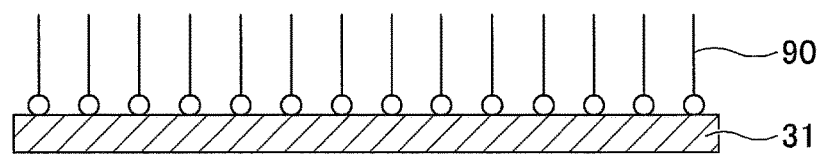

Next, in a process illustrated in FIG. 3B, a Self-assembled monolayer film (SAM film) 90 is formed on an entire surface of the lower electrode 31. The SAM film 90 uses a phenomenon in which alkanethiol is self-assembled (self-arranged) on a specific metal. For example, the SAM film 90 can be acquired by dipping the substrate 10, on which the lower electrode 31 is formed, into an alkanethiol solution (liquid) so that the SAM film 90 is self-assembled. For example, $CH_3(CH_2)$—SH may be used as the SAM film 90.

Figure 3C:
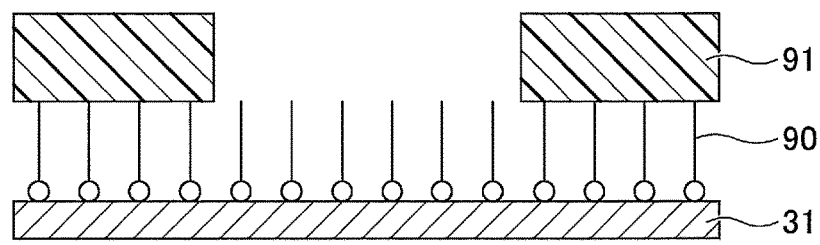

Next, in a process illustrated in FIG. 3C, a photoresist layer 91, patterned by photolithography, is formed in order to remove a part, at which a PZT precursor is to be formed in subsequent processes, of the SAM film 90 and in order to protect a necessary part of the SAM film 90.

Figure 4A:
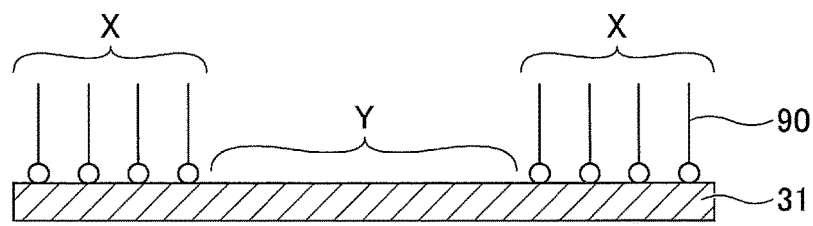
FIGS. 4A to 4C are diagrams (part 2) illustrating an example of processes of producing the electromechanical transducer element according to the first embodiment.

Next, in a process illustrated in FIG. 4A, for example, oxygen plasma or ultraviolet light is emitted via the photoresist layer 91 to remove the part, at which the PZT precursor is to be formed, of the SAM film 90. In other words, the PZT precursor may be formed on the removed part. Then, after removing the SAM film 90, the photoresist layer 91 is exfoliated. Because an alkyl group is arranged on the SAM film 90, the SAM film 90 has a hydrophobic (water-repellent) property. A part at which the SAM film 90 is removed has a hydrophilic property. In the following, an area, corresponding to X in FIG. 4, at which the SAM film 90 is formed may be referred to as a hydrophobic property part and an area, corresponding to Y in FIG. 4, at which the SAM film 90 is removed may be referred to as a hydrophilic property part.

Figure 4B:
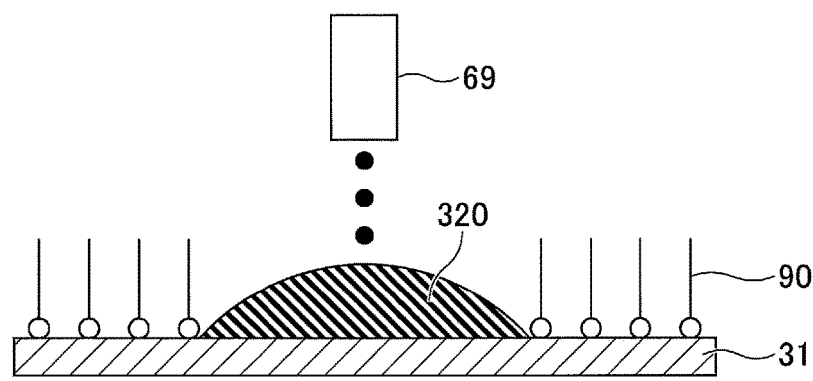

Next, in a process illustrated in FIG. 4B, a PZT precursor solution (first liquid) is synthesized from predetermined starting materials. Then, the ink jet head 69 of the ink jet applying apparatus 60 illustrated in FIG. 2 lands (ejects) liquid droplets of the PZT precursor solution on the lower electrode 31 to form a PZT application film (first application film) 320. The PZT application film 320 is not formed on the SAM film 90 that is the hydrophobic part but is formed only on the hydrophilic part where the SAM film 90 is removed because of a contrast of contact angles.

Figure 4C:
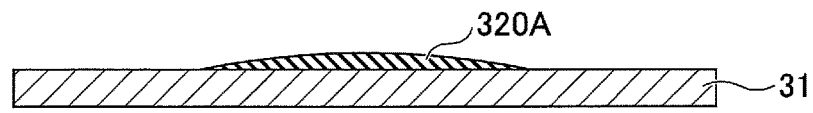

Next, in a process illustrated in FIG. 4C, a heating treatment for thermally decomposing organic substances and for drying the solvent are applied to the PZT application film 320 to form a PZT film 320A. Because a pattern is formed in a state of liquid, the PZT application film 320 formed by an inkjet method becomes the PZT film 320A by surface tension of the solution at the time of drying. In the cross section, the PZT film 320A has a protruding curved shape. For example, a heat source apparatus such as a hot plate or a clean oven may be used in the heating treatment as appropriate. Here, the SAM film 90 disappears when the heating treatment is applied. The transformation (change) from the PZT application film 320 to the PZT film 320A is accompanied by volume shrinkage. A film thickness of the PZT film 320A obtained in one time processing can be adjusted by adjusting a solid content concentration of the PZT precursor solution.

Figure 5A:
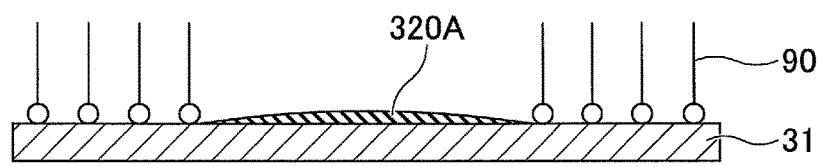
FIGS. 5A to 5D are diagrams (part 3) illustrating an example of processes of producing the electromechanical transducer element according to the first embodiment.

Next, in a process illustrated in FIG. 5A, after the structure illustrated in FIG. 4C is washed with isopropyl alcohol or the like, the SAM film 90 is formed in a manner similar to that illustrated in FIG. 3B. In the second or subsequent time, because the SAM film 90 is not formed on the oxide film, the pattern of the SAM film 90 illustrated in FIG. 5A can be obtained without performing the process of photolithography. The SAM film 90 has the hydrophobic (water-repellent) property, and the PZT film 320A has the hydrophilic property.

Figure 5B:
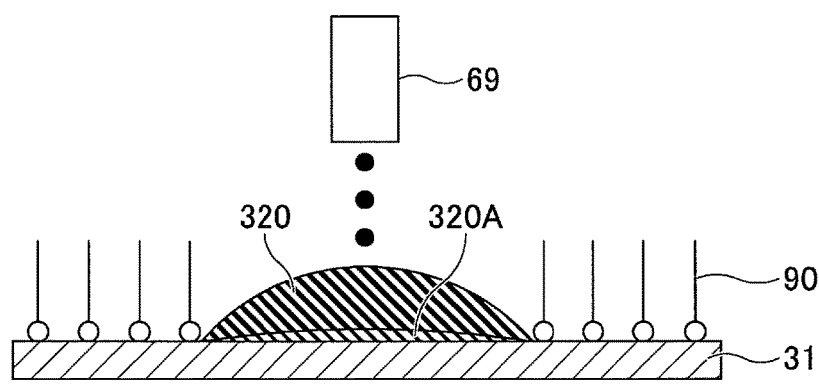

Next, in a process illustrated in FIG. 5B, a position of the ink jet head 69 is adjusted over (with respect to) the PZT film 320A. Then, the ink jet head 69 lands (ejects) liquid droplets of the PZT precursor solution on the PZT film 320A to form the PZT application film 320. The PZT application film 320 is not formed on the SAM film 90, which is the hydrophobic part, but is formed only on the PZT film 320A, which is the hydrophilic part, because of a contrast of contact angles.

Figure 5C:
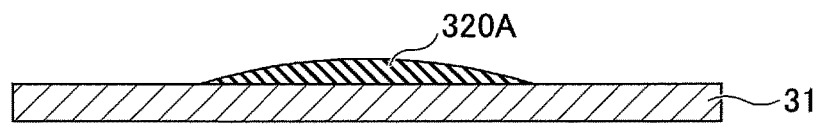

Next, in a process illustrated in FIG. 5C, similar to the process in illustrated in FIG. 4C, a heating treatment for thermally decomposing the organic substances and for drying the solvent are applied to the PZT application film 320 to thicken the PZT film 320A. Here, the SAM film 90 disappears when the heating treatment is applied.

Figure 5D:
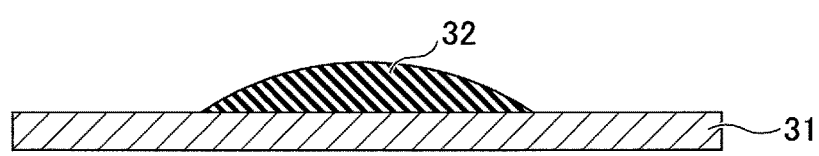

Next, in a process illustrated in FIG. 5D, the PZT film, which is the electromechanical transducer film 32, is formed. Specifically, the processes illustrated in FIGS. 5A to 5C are repeated for a necessary number of times to further thicken the PZT film 320A. After that, the heating treatment for crystallization is performed. Thus, the crystallized PZT film can be obtained as the electromechanical transducer film 32. For example, a Rapid Thermal Annealing (RTA) apparatus by an infrared lamp, a laser light emitting apparatus, or the like may be used for the heating treatment for crystallizing the PZT film. In other words, the processes illustrated in FIG. 5A to 5C are repeated to crystallize the PZT application film 320 to form the electromechanical transducer film 32.

Figure 6A:
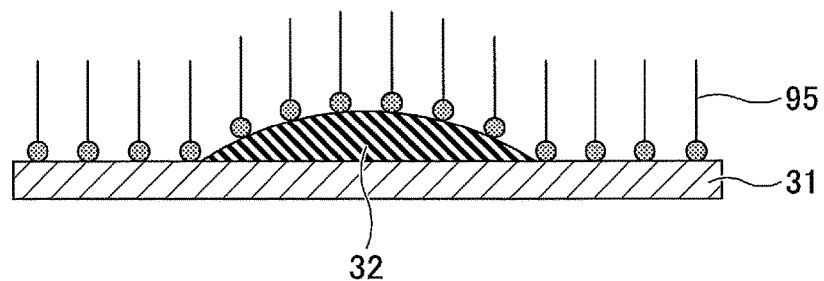
FIGS. 6A to 6C are diagrams (part 4) illustrating an example of processes of producing the electromechanical transducer element according to the first embodiment.

Next, in a process illustrated in FIG. 6A, a Self-assembled monolayer film (SAM film) 95 is formed on the lower electrode 31 and on the electromechanical transducer film 32 in a manner similar to that of the process illustrated in FIG. 3B. Here, because it is desired to form the SAM film 95 also on the electromechanical transducer film 32, a material such as a silane coupling agent that can be formed on the electromechanical transducer film 32 is used as the SAM film 95.

Figure 6B:
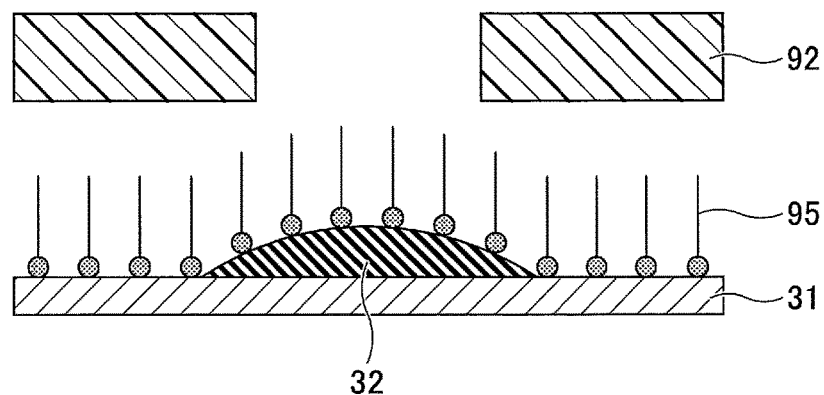

Next, in a process illustrated in FIG. 6B, a photoresist layer 92, patterned by photolithography, is formed in order to remove a part, at which the upper electrode 33 is to be formed in subsequent processes, of the SAM film 95 and in order to protect a necessary part of the SAM film 95.

Figure 6C:
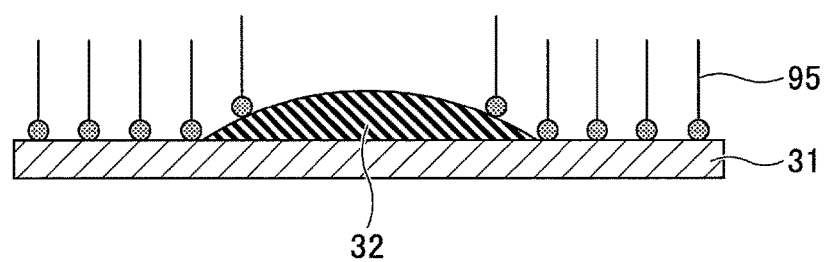

Next, in a process illustrated in FIG. 6C, for example, oxygen plasma or ultraviolet light is emitted via the photoresist layer 92 to remove the part, at which the upper electrode 33 is to be formed, of the SAM film 95. Then, after removing the SAM film 95, the photoresist layer 92 is exfoliated. Note that a size of an opening of the photoresist layer 92 is adjusted in the process illustrated in FIG. 6B such that the SAM film 95 remains in an outer peripheral portion of the electromechanical transducer film 32 in the process illustrated in FIG. 6C.

Figure 7A:
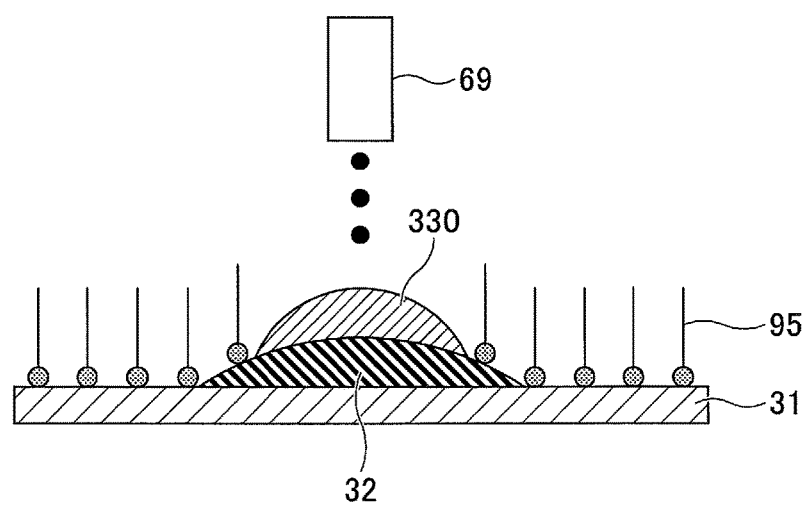
FIGS. 7A and 7B are diagrams (part 5) illustrating an example of processes of producing the electromechanical transducer element according to the first embodiment.

Next, in a process illustrated in FIG. 7A, the ink jet head 69 lands (ejects) liquid droplets of a liquid solution (second liquid) including the material of the upper electrode 33 on the electromechanical transducer film 32 to form an upper electrode application film (second application film) 330. The upper electrode application film 330 is not formed on the SAM film 95 that is the hydrophobic part but is formed only on the hydrophilic part where the SAM film 95 is removed because of a contrast of contact angles. That is, the upper electrode application film 330 is formed on an area except for the outer peripheral portion on the electromechanical transducer film 32. A material of the upper electrode 33 may be selected from the above described materials as appropriate. For example, gold may be used.

Figure 7B:
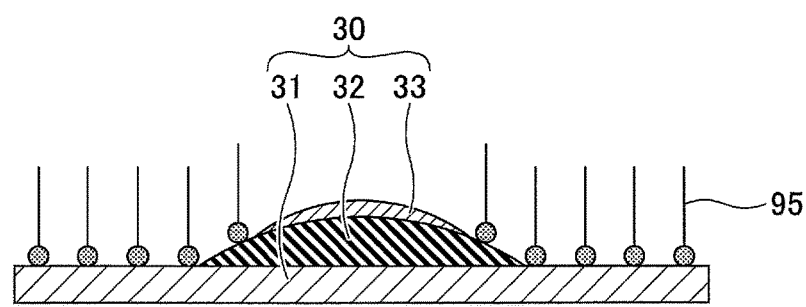

Next, in a process illustrated in FIG. 7B, the upper electrode application film 330 is dried and burned to form the upper electrode 33. Because a pattern is formed in a liquid state, the upper electrode application film 330, formed by the ink jet method, becomes the upper electrode 33 having a protruding curved shape in the cross section due to surface tension of the liquid solution when being dried. In this way, the electromechanical transducer element 30 is accomplished (produced). In a case where gold is used as the material of the upper electrode 33, a drying and burning temperature may be about 200° C., for example. For example, a heat source apparatus such as a hot plate or a clean oven may be used in the drying and burning as appropriate. For example, a film thickness of the upper electrode 33 may be in a range of from about 0.05 μm to 1 μm. Here, because the upper electrode 33 is not formed on the outer peripheral portion on the electromechanical transducer film 32, the upper electrode 33 does not short-circuit with the lower electrode 31.

In the processes illustrated in FIGS. 3 to 7, an example of forming the electromechanical transducer element 30 using the PZT film as the electromechanical transducer film 32 is described. However, the present disclosure is not limited to this. For example, other than PZT, an $ABO_3$-type perovskite crystal film may be used as the electromechanical transducer film 32. For example, a non-lead composite oxide film such as barium titanate may be used as the $ABO_3$-type perovskite crystal film other than PZT. In this case, it is possible to prepare a barium titanate precursor solution by dissolving, in a common solvent, a barium alkoxide and a titanium alkoxide compound as the starting materials.

Figure 8A:
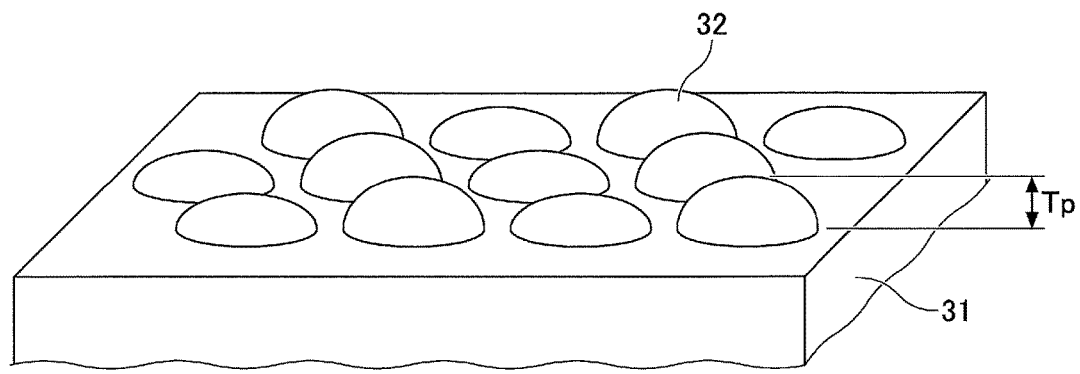
FIG. 8A is a perspective view of an example in which a plurality of electromechanical transducer films are formed on one wafer according to the first embodiment.
Figure 8B:
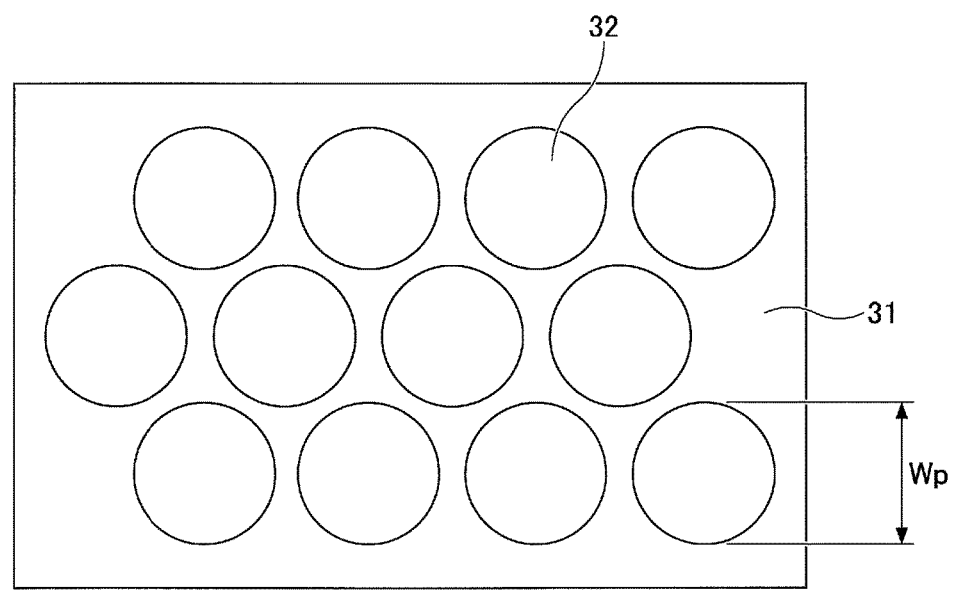
FIG. 8B is a plan view of the example in which the plurality of electromechanical transducer films are formed on the wafer according to the first embodiment.
Figure 9A:
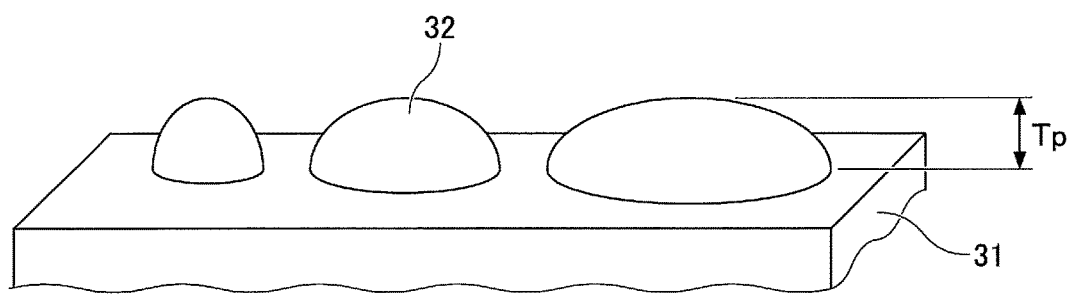
FIG. 9A is a perspective view of another example in which a plurality of electromechanical transducer films are formed on one wafer according to the first embodiment.
Figure 9B:
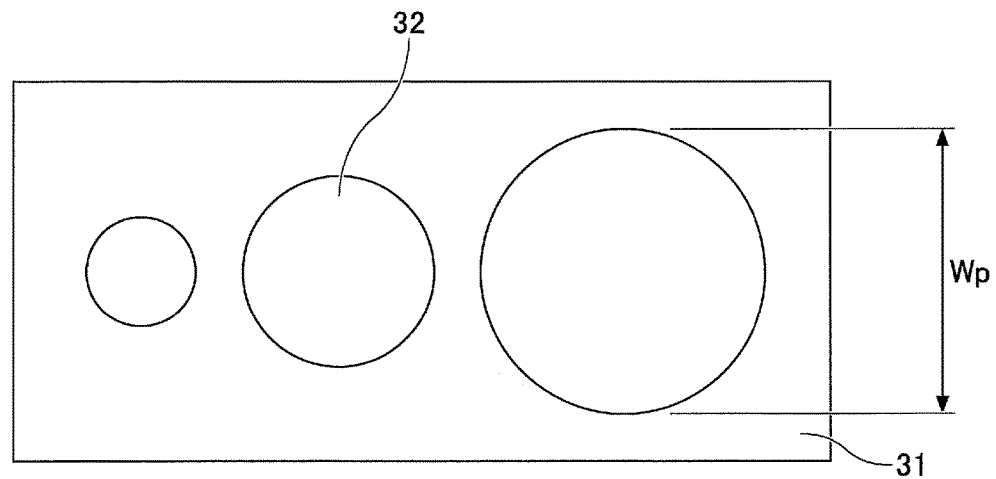
FIG. 9B is a plan view of the other example in which the plurality of electromechanical transducer films are formed on the wafer according to the first embodiment.

An example of forming one electromechanical transducer film 32 on the substrate 10 is illustrated in FIGS. 3 to 7. However, as illustrated in FIGS. 8 and 9, a plurality of electromechanical transducer films 32 may be formed on one substrate 10 (for example, 6 inch wafer). Each of FIGS. 8A and 9A is a perspective view and each of FIGS. 8B and 9B is a plan view. Note that layers, disposed under the lower electrode 31, and the upper electrode 33 are omitted in FIGS. 8 and 9.

FIGS. 8A and 8B illustrate an example in which a plurality of electromechanical transducer films 32 are formed on the lower electrode 31 formed on one substrate 10. Each electromechanical transducer film 32 illustrated in FIGS. 8A and 8B has the same width Wp and a different maximum height Tp. FIGS. 9A and 9B illustrate an example in which a plurality of electromechanical transducer films 32 are formed on the lower electrode 31 formed on one substrate 10. Each electromechanical transducer film 32 illustrated in FIGS. 9A and 9B has a different width Wp and the same maximum height Tp.

Figure 10A:
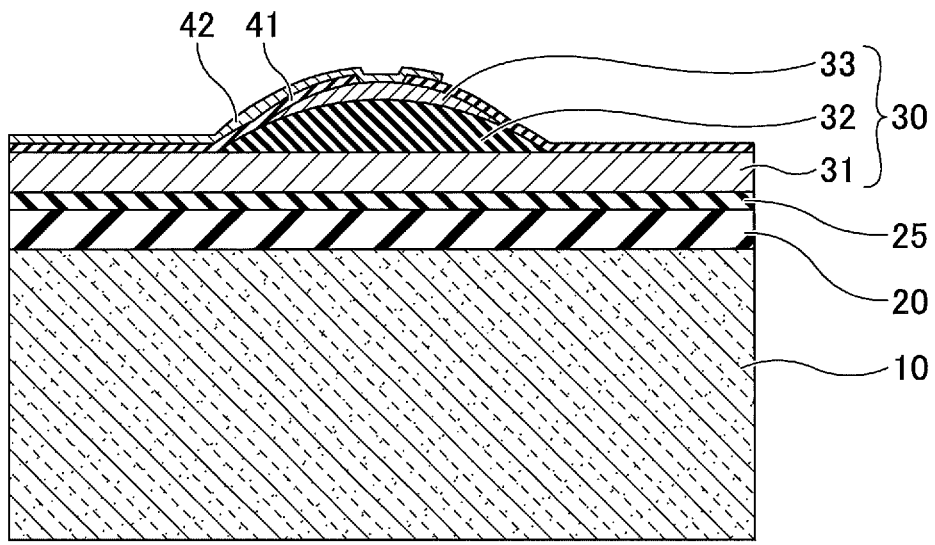
FIG. 10A is a cross section of the electromechanical transducer film and an upper electrode formed by an ink jet method according to the first embodiment.
Figure 10B:
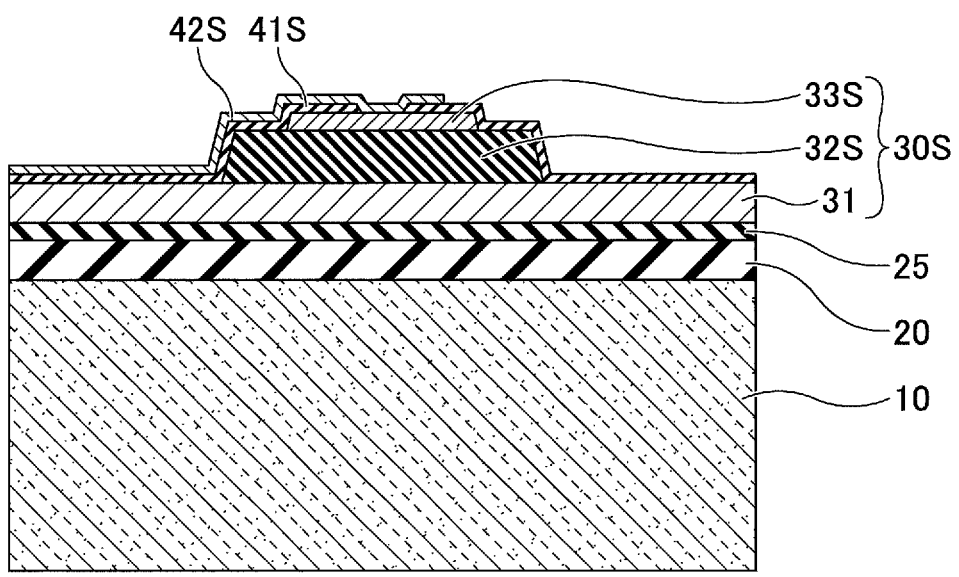
FIG. 10B is a cross section of an electromechanical transducer film, formed by a spin coating method, and an upper electrode, formed by a sputtering method.

FIGS. 10A and 10B are diagrams that compare cross sections of the upper electrodes and the electromechanical transducer films formed by different methods. FIG. 10A schematically illustrates the cross section of the electromechanical transducer element 30 in which the electromechanical transducer film 32 and the upper electrode 33 are formed by the inkjet method. An insulating film 41 and wiring 42 for applying voltage are formed on the upper electrode 33.

FIG. 10B schematically illustrates the cross section of an electromechanical transducer element 30S in which an electromechanical transducer film 32S is formed by a spin coating method and an upper electrode 33S is formed by a sputtering method. An insulating film 41S and wiring 42S for applying voltage are formed on the upper electrode 33S.

First, a film, which becomes the electromechanical transducer film 32S, is formed on the entire surface of the lower electrode 31 by the spin coating method so as to form the electromechanical transducer element 30S. Then, a film, which becomes the upper electrode 33S, is formed by the sputtering method on the entire surface of the film, which becomes the electromechanical transducer film 32S. Further, respective films are patterned by etching to form the electromechanical transducer film 32S and the upper electrode 33S having shapes as illustrated in FIG. 10B.

As illustrated in FIG. 10A, on the electromechanical transducer film 32 and the upper electrode 33 formed by the ink jet method, a sharply angled step is not present and the smooth insulating film 41 and the smooth wiring 42 are formed.

On the other hand, as illustrated in FIG. 10B, step parts are formed on end portions of the electromechanical transducer film 32S and the upper electrode 33S formed by combining the spin coating method, the sputtering method, and the etching. Then, the insulating film 41S and the wiring 42S greatly bent along the step parts are formed. In the step part as illustrated in FIG. 10B, the insulating film 41S and the wiring 42S often crack, the film thickness often becomes thinner, and a defect such as a short circuit and a leak may occur.

In this way, according to the electromechanical transducer element 30, the electromechanical transducer film 32 and the upper electrode 33 are directly patterned and formed by the ink jet method without using a process of photolithography. That is, the electromechanical transducer film 32 and the upper electrode 33 are dried and formed after being patterned in a state in which the materials are in the liquid state. Thus, it is possible to form, in an excellent reproducibility state determined according to the surface tension of liquid, a smooth cross-sectional shape without an edge. As a result, it becomes possible to reduce a risk that the insulating film 41 and the wiring 42, formed on the electromechanical transducer film 32 and on the upper electrode 33, are cracked or broken (disconnected) in the subsequent processes, and to improve connection reliability of the wiring.

It is possible, by using the ink jet method to form the electromechanical transducer film 32 and the upper electrode 33, to reduce materials to be discarded, and to reduce cost of producing the electromechanical transducer element 30, and to enhance the productivity.

Recently, it is requested to form an electromechanical transducer film and an upper electrode on a thin flexible substrate for using it as a wearable sensor. However, it is difficult to pattern the electromechanical transducer film and the upper electrode on the flexible substrate with photolithography. Further, because the substrate is soft, position adjustment and application of the resist cannot be performed. On the other hand, according to the first embodiment, because the electromechanical transducer film 32 and the upper electrode 33 are directly patterned and formed by the ink jet method without a process of photolithography, it is possible to easily form the electromechanical transducer film 32 and the upper electrode 33 on a flexible substrate or a large area substrate.

Working Example 1

(Production of the Electromechanical Transducer Element 30)

The electromechanical transducer element 30 was made based on the processes illustrated in FIGS. 3 to 7. Specifically, first, in the process illustrated in FIG. 3A, the vibrating plate 20, the adhesive layer 25, and the lower electrode 31 were sequentially stacked on the substrate 10. A silicon substrate was used as the substrate 10. $TiO_2$ was used for the adhesive layer 25, and Pt was used for the lower electrode 31.

Next, in the process illustrated in FIG. 3B, the SAM film 90 was formed on the entire surface of the lower electrode 31 by dipping the substrate 10, on which the lower electrode 31 is formed, into an alkanethiol solution so that the SAM film 90 is self-assembled. Here, $CH_3(CH_2)$—SH was be used as the SAM film 90.

Next, in the processes illustrated in FIG. 3C and FIG. 4A, the SAM film 90 was patterned. A contact angle of the SAM film 90 with respect to pure water was 92 degrees and the SAM film 90 had a hydrophobic (water-repellent) property. A contact angle of the lower electrode 31 of the part, at which the SAM film 90 was removed, was 54 degrees and the lower electrode 31 had a hydrophilic property.

Next, in the process illustrated in FIG. 4B, liquid droplets of the PZT precursor solution were landed (ejected) by the ink jet head 69 of the ink jet applying apparatus 60 illustrated in FIG. 2 on the lower electrode 31 to form the PZT application film 320. Because of the contrast of contact angles, the PZT application film 320 was not formed on the SAM film 90 that is the hydrophobic part but was formed only on the hydrophilic part where the SAM Film 90 was removed.

In the PZT precursor solution, lead acetate trihydrate, isopropoxide titanium, and isopropoxide zirconium were used as the starting materials. The crystal water of lead acetate was dissolved in methoxy ethanol and then, dehydrated. At this time, a lead amount was adjusted to be 10 mol % excess with respect to the stoichiometric composition. The reason of this is to prevent the degradation of the crystallinity due to evaporation of lead during a heating treatment.

Isopropoxide titanium and isopropoxide zirconium were dissolved in methoxy ethanol, and an alcohol exchange reaction and an esterification reaction were processed, so as to uniformly mix with the methoxy ethanol solution where lead acetate was dissolved, to synthesize the PZT precursor solution. A PZT concentration of the PZT precursor solution was adjusted to be about 0.1 mol/liter.

Next, in the process illustrated in FIG. 4C, the heating treatment for thermally decomposing organic substances and for drying the solvent was applied to the PZT application film 320 to form the PZT film 320A. A temperature of the solvent drying was set to be about 120° C. and a temperature of the thermal decomposition was set to be about 500° C. A film thickness, which is a maximum height, of the PZT film 320A was about 90 nm. The SAM film 90 disappeared when the heating treatment was applied.

Next, in the process illustrated in FIG. 5A, after the structure illustrated in FIG. 4C was washed with isopropyl alcohol, the SAM film 90 was formed in a manner similar to that illustrated in FIG. 3B. A contact angle of the SAM film 90 with respect to pure water was about 92 degrees and the SAM film 90 had a hydrophobic (water-repellent) property. A contact angle of the PZT film 320A was about 34 degrees and the PZT film 320A had a hydrophilic property.

Next, in the process illustrated in FIG. 5B, a position of the ink jet head 69 was adjusted over (with respect to) the PZT film 320A, and liquid droplets of the PZT precursor solution were landed (ejected) by the ink jet head 69 to form the PZT application film 320. Because of the contrast of contact angles, the PZT application film 320 was not formed on the SAM film 90 that is the hydrophobic part but was formed only on the PZT film 320A that is the hydrophilic part.

Next, in the process illustrated in FIG. 5C, similar to the process in illustrated in FIG. 4C, the heating treatment for thermally decomposing the organic substances and for drying the solvent was applied to the PZT application film 320 to thicken the PZT film 320A. The film thickness of the thickened PZT film 320A was about 180 nm. The SAM film 90 disappeared when the heating treatment was applied.

Next, in the process illustrated in FIG. 5D, a PZT film, which is the electromechanical transducer film 32, was formed. Specifically, the processes illustrated in FIGS. 5A to 5C were repeated for 6 times to make the film thickness of the PZT film 320A about 540 nm and the heating treatment for crystallization was performed. Further, the processes illustrated in FIGS. 5A to 5C were repeated for 6 times and the heating treatment for crystallization was performed. In this way, the crystallized PZT film of which the film thickness is about 1000 nm could be obtained as the electromechanical transducer film 32. A temperature of the crystallization was about 700° C. The RTA was used for the heating treatment for the crystallization.

Next, in the process illustrated in FIG. 6A, the SAM film 95 was formed on the lower electrode 31 and on the electromechanical transducer film 32 in a manner similar to that of the process illustrated in FIG. 3B. Here, because it was desired to form the SAM film 95 also on the electromechanical transducer film 32, a silane coupling agent was used as the SAM film 95.

Next, in the processes illustrated in FIGS. 6B and 6C, the SAM film 95 was patterned. Here, a size of an opening of the photoresist layer 92 was adjusted in the process illustrated in FIG. 6B such that the SAM film 95 remains in the outer peripheral portion of the electromechanical transducer film 32 in the process illustrated in FIG. 6C.

Next, in the process illustrated in FIG. 7A, liquid droplets of the material of the upper electrode were landed (ejected) on the electromechanical transducer film 32 by the ink jet head 69 to form the upper electrode application film 330. Because of the contrast of contact angles, the upper electrode application film 330 was not formed on the SAM film 95 that is the hydrophobic part but was formed only on the hydrophilic part where the SAM film 95 was removed. That is, the upper electrode application film 330 was formed on an area except for the outer peripheral portion on the electromechanical transducer film 32. Gold was used as the material of the upper electrode 33.

Next, in the process illustrated in FIG. 7B, the upper electrode application film 330 was dried and burned to form the upper electrode 33. In this way, the electromechanical transducer element 30 was accomplished (produced). A temperature of drying and burning the upper electrode 33 was about 200° C. In the produced electromechanical transducer element 30, the width Wp of the electromechanical transducer film 32 was 60 μm and the width We of the upper electrode 33 was 48 μm.

(Measurement of the Electromechanical Transducer Element 30)

As for the produced electromechanical transducer element 30, surfaces of the electromechanical transducer film 32 and the upper electrode 33 were measured by a surface roughness meter. It should be noted that shapes of the surfaces of the electromechanical transducer film 32 and the upper electrode 33 may be measured by a non-contact three-dimensional shape measuring device such as a scanning white interference microscope.

Figure 11:
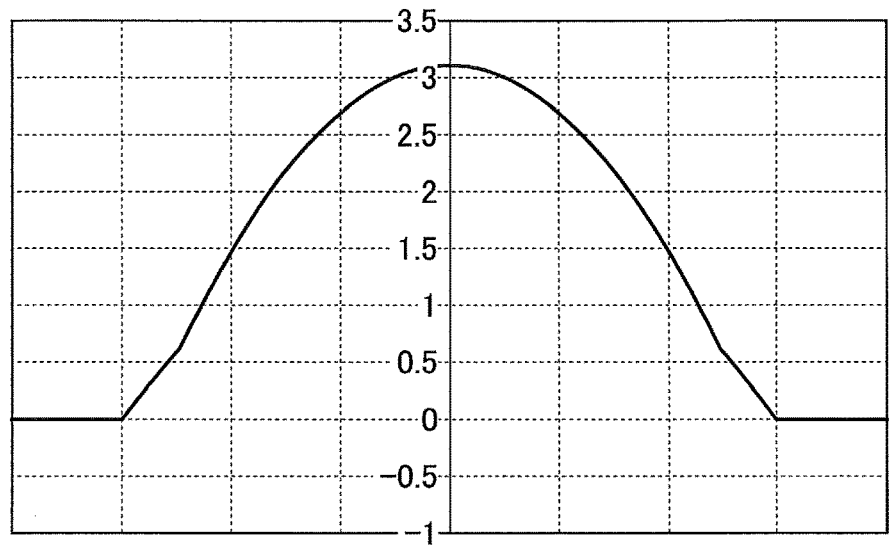
FIG. 11 is a graph illustrating a measurement result of surfaces of the electromechanical transducer film and the upper electrode according to the first embodiment.
Figure 12:
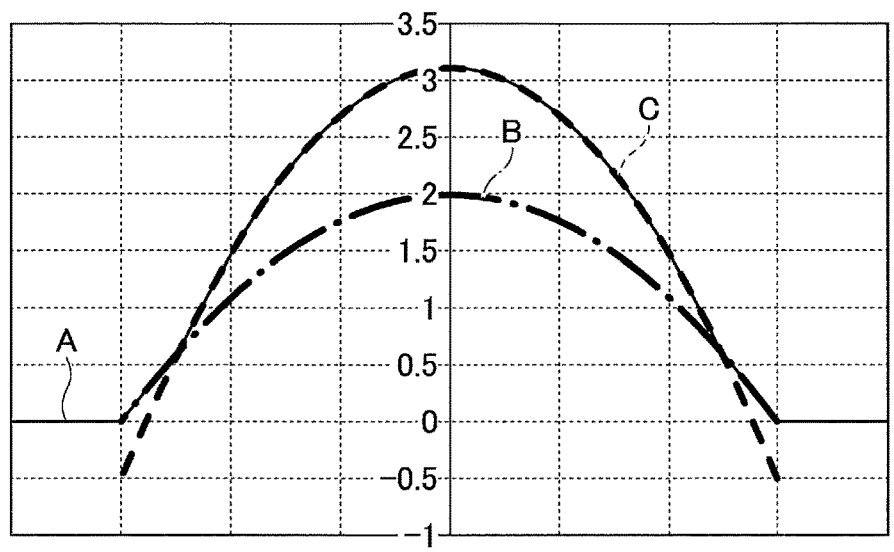
FIG. 12 is a graph in which a curved line corresponding to an approximation formula of the cross section of the electromechanical transducer film and a curved line corresponding to an approximation formula of a cross section of the upper electrode are superimposed and displayed on the graph of FIG. 11.

FIG. 11 illustrates a measurement result of the surfaces of the electromechanical transducer film 32 and the upper electrode 33. FIG. 12 illustrates a graph in which curved lines corresponding to approximation formulas of the cross sections of the electromechanical transducer film 32 and the upper electrode 33 are superimposed and displayed on the obtained cross section of FIG. 11. In FIG. 12, solid line A corresponds to measured values illustrated in FIG. 11, chain line B is the curved line corresponding to the approximation formula "$y=-0.0022x^2+2$" that represents the film thickness distribution shape of the electromechanical transducer film 32. Further, dotted line C is the curved line corresponding to the approximation formula "$y=-0.004x^2+3.11$" that represents the film thickness distribution shape of the upper electrode 33.

As illustrated, in the cross section, each of the film thickness distribution shape of the electromechanical transducer film 32 formed by the ink jet method and the film thickness distribution shape of the upper electrode 33 formed by the ink jet method is a protruding curved shape, and each of the film thickness of the electromechanical transducer film 32 and the film thickness of the upper electrode 33 becomes gradually thinner toward end portions from a maximum height portion. Such a film thickness distribution shape matches an approximation formula of a quadratic function very well. As a result, because the film thickness of the electromechanical transducer film 32 and the film thickness of the upper electrode 33 at an arbitrary position are accurately recognized from the film thicknesses and the widths of the patterns, it becomes easy to design a structure of the electromechanical transducer element 30.

Working Example 2

Figure 13:
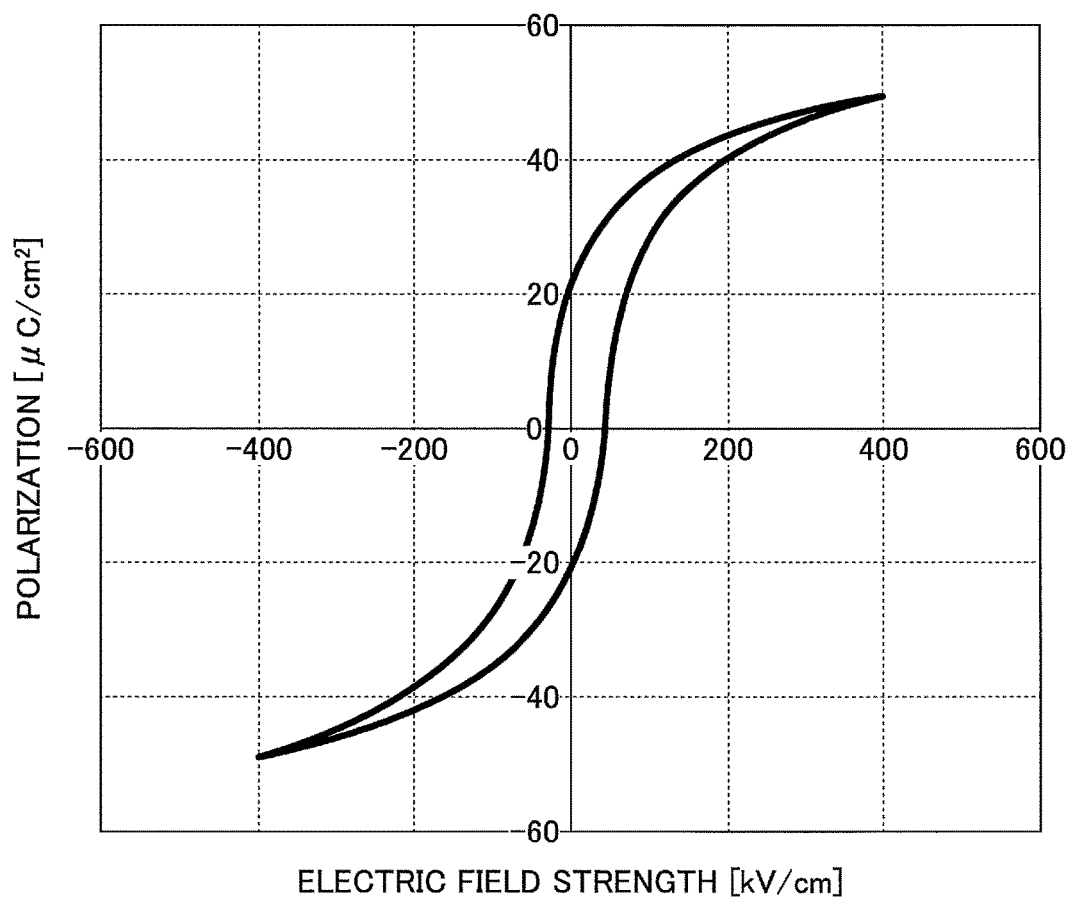
FIG. 13 is a graph illustrating a P-E hysteresis curved line obtained in working example 2.

The electromechanical transducer element 30 was produced in a manner similar to that of working example 1 and electric properties of the electromechanical transducer element 30 were evaluated. As a result of evaluating the electric properties, a relative permittivity of the electromechanical transducer film 32 (PZT film) was 1220, a dielectric loss was 0.02, a residual polarization was 19.3 μC/cm$^2$, and a coercive electric field was 36.5 kV/cm, which are properties equivalent to properties of a normal ceramic sintered body. FIG. 13 illustrates a P-E hysteresis curved line obtained at the time of evaluation.

Working Example 3

Except for using, as the substrate 10, a stainless substrate having a thickness of 50 μm instead of the silicone substrate, the electromechanical transducer element 30 was produced in a manner similar to that of working example 1 to evaluate electric properties of the electromechanical transducer element 30. Although a size of the silicon substrate is limited, a size of the stainless substrate is not limited significantly. Therefore, a square substrate of which each side is about 1 meter may be used if there is an apparatus that can sputter platinum that becomes the lower electrode 31. As a result of evaluating the electric properties of the electromechanical transducer element 30 that uses the stainless substrate, a capability similar to that of the silicone substrate was obtained.

Working Example 4

(Production of the Electromechanical Transducer Element 30)

The electromechanical transducer element 30 was made based on the processes illustrated in FIGS. 3 to 7. Specifically, first, the processes illustrated in FIG. 3A to 4B were implemented in a manner similar to that of working example 1. It should be noted that a PZT concentration of the PZT precursor solution, used in the process illustrated in FIG. 4B, was adjusted to be about 0.5 mol/liter.

Next, in the process illustrated in FIG. 4C, the heating treatment for thermally decomposing the organic substances and for drying the solvent was applied to the PZT application film 320 to form the PZT film 320A. A temperature of the solvent drying was set to be about 120° C. and a temperature of the thermal decomposition was set to be about 400° C. A film thickness of the PZT film 320A was about 500 nm. The SAM film 90 disappeared when the heating treatment was applied.

Next, in the process illustrated in FIG. 5A, after the structure illustrated in FIG. 4C was washed with isopropyl alcohol, the SAM film 90 was formed in a manner similar to that illustrated in FIG. 3B. A contact angle of the SAM film 90 with respect to pure water was about 92 degrees and the SAM film 90 had a hydrophobic (water-repellent) property. A contact angle of the PZT film 320A was about 34 degrees and the PZT film 320A had a hydrophilic property.

Next, in the process illustrated in FIG. 5B, a position of the ink jet head 69 was adjusted over (with respect to) the PZT film 320A, and liquid droplets of the PZT precursor solution was landed (ejected) by the ink jet head 69 on the PZT film 320A to form the PZT application film 320. Because of the contrast of contact angles, the PZT application film 320 was not formed on the SAM film 90 that is the hydrophobic part but was formed only on the PZT film 320A that is the hydrophilic part.

Next, in the process illustrated in FIG. 5C, similar to the process in illustrated in FIG. 4C, the heating treatment for thermally decomposing the organic substances and for drying the solvent was applied to the PZT application film 320 to thicken the PZT film 320A. The film thickness of the thickened PZT film 320A was about 1 μm. The SAM film 90 disappeared when the heating treatment was applied.

Next, in the process illustrated in FIG. 5D, a PZT film, which is the electromechanical transducer film 32, was formed. Specifically, the processes illustrated in FIGS. 5A to 5C were repeated for 10 times to make the film thickness of the PZT film 320A about 10 μm and the heating treatment for crystallization was performed. In this way, the crystallized PZT film of which the film thickness is about 10 μm could be obtained as the electromechanical transducer film 32. A temperature of the crystallization was about 700° C. The RTA was used for the heating treatment for the crystallization.

Next, in a manner similar to that of working example 1, the processes illustrated in FIG. 6A to 7B were carried out to produce the electromechanical transducer element 30.

Here, according to working example 4, a plurality of electromechanical transducer elements 30, each of which includes an electromechanical transducer film 32 (PZT film) having a maximum height Tp 5 μm or greater (about 10 μm) and a different width Wp, were produced by the above described processes. Here, a planar shape of the formed electromechanical transducer film 32 was a substantially circular shape. Accordingly, the width Wp is a diameter of the electromechanical transducer film 32 in a plan view.

(Measurement of the Electromechanical Transducer Element 30)

FIG. 14 illustrates a relationship between an image of a cross-sectional shape and a width Wp of an electromechanical transducer film 32 in each produced electromechanical transducer element 30. As illustrated in FIG. 14, in a case where the maximum height Tp of the electromechanical transducer film 32 is made to be 5 μm or longer, it is determined that the film formation quality is OK when the width Wp is equal to or greater than 20 μm and equal to or less than 500 μm. Then, an ideal cross-sectional shape of which the film thickness distribution shape is a protruding shape toward the upper electrode 33 was obtained.

On the other hand, when the width Wp was less than 20 μm, the pattern protruded when forming the PZT application film that becomes the electromechanical transducer film 32. Thus, the electromechanical transducer film 32 having a desired width Wp could not be obtained. When the width Wp was greater than 500 μm, the cross-sectional shape degraded. Specifically, liquid droplets congregated at a part, the part became thicker locally, and a uniform pattern was not obtained, or due to a coffee-stain phenomenon, an edge of the outer peripheral portion of the pattern protruded and a center portion became thinner.

It was confirmed that in a case where the maximum height Tp of the electromechanical transducer film 32 is made to be 5 μm or longer, the film thickness distribution shape is a protruding shape toward the upper electrode 33 side and the film thickness distribution shape is approximated by the formula 1: $y=-ax^2+b$ with high accuracy when the width Wp is equal to or longer than 20 μm and equal to or shorter than 500 μm. That is, it was confirmed that in the case where the maximum height Tp of the electromechanical transducer film 32 is made to be 5 μm or longer, the electromechanical transducer film 32 is self-formed to have the film thickness distribution shape represented by the formula 1: $y=-ax^2+b$ when the width Wp is equal to or longer than 20 μm and equal to or shorter than 500 μm.

Further, in the case where the maximum height Tp of the electromechanical transducer film 32 is made to be 5 μm or longer, in any electromechanical transducer film 32, the coefficient a satisfies a relationship of $0.8\times(4Tp/Wp^2)<a<1.2\times(4Tp/Wp^2)$ when the width Wp is equal to or longer than 20 μm and equal to or shorter than 500 μm. In the relationship, the maximum height Tp [μm] and the width Wp [μm] are used. Further, the coefficient b satisfies a relation of $0.8\times Tp<b<1.2\times Tp$.

Further, it was confirmed that in the case where the maximum height Tp of the electromechanical transducer film 32 is made to be 5 μm or longer, the film thickness distribution shape of the upper electrode 33 is approximated by the formula 2: $y=-cx^2+d$ with high accuracy when the width Wp is equal to or longer than 20 μm and equal to or shorter than 500 μm. Further, in any upper electrode 33, the coefficient c satisfies a relationship of $0.8\times(4Te/We^2)<c<1.2\times(4Te/We^2)$ where the maximum height Te [μm] and the width We [μm] are used. Further, the coefficient d satisfies a relationship of $0.8\{Tm-(4Tp^2/We^2)\times We^2+Tp\}<d<1.2\{Tm-(4Tp^2/We^2)\times We^2+Tp\}$ On the other hand, when the width Wp of the electromechanical transducer film 32 was less than 20 μm or when the width Wp of the electromechanical transducer film 32 was greater than 500 μm, the film thickness distribution shape of the electromechanical transducer film 32 could not be approximated by the formula 1: $y=-ax^2+b$, and the coefficient a and the coefficient b did not satisfy the above relationships. Similarly, the film thickness distribution shape of the upper electrode 33 could not be approximated by the formula 2: $y=-cx^2+d$, and the coefficient c and the coefficient d did not satisfy the above relationships.

In this way, according to the electromechanical transducer film 32 formed by the ink jet method, in the case where the maximum height Tp of the electromechanical transducer film 32 is made to be 5 µm or longer, it is possible to prevent the pattern shape from being degraded and to realize (form) the highly reproducible film thickness distribution shape by making the width Wp to be equal to or longer than 20 µm and equal to or shorter than 500 µm.

Further, the PZT density of the PZT precursor solution was made high and the precursor solution was partially applied onto the lower electrode 31 by the ink jet method. Therefore, a stress of the application film was small even when the film thickness per layer was increased, and a crack did not occur at the time of crystallization even when the maximum height Tp of the electromechanical transducer film 32 was made to be 5 µm or longer. It is possible to realize (form) the electromechanical transducer element 30, with which effective vibration and deformational displacement can be obtained, by making the maximum height Tp of the electromechanical transducer film 32 to be a film thickness of 5 µm or longer.

Second Embodiment

According to a second embodiment, an example of a liquid ejecting head using the electromechanical transducer element 30 will be described. In the following descriptions of the second embodiment, descriptions of elements same as the elements already described in the first embodiment may be omitted as appropriate.

Figure 15:
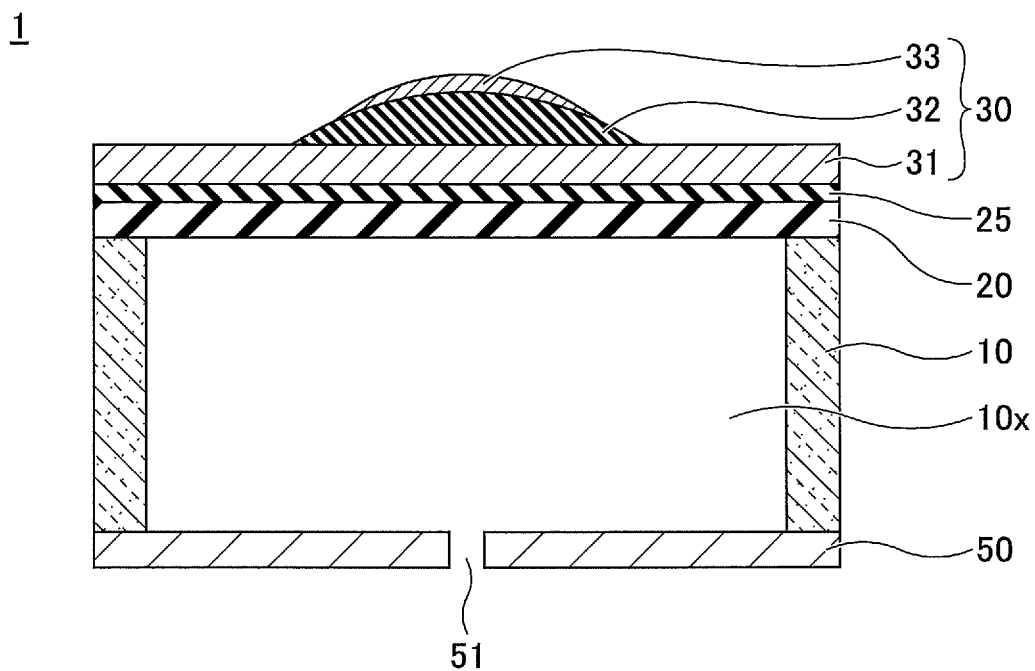
FIG. 15 is a cross-sectional view (part 1) illustrating an example of a liquid ejecting head according to a second embodiment.

FIG. 15 is a cross-sectional view illustrating an example of a liquid ejecting head 1 according to the second embodiment. The liquid ejecting head 1 illustrated in FIG. 15 includes the substrate 10, the vibrating plate 20, the adhesive layer 25, and the electromechanical transducer element 30.

In the liquid ejecting head 1, the vibrating plate 20 is formed on the substrate 10, the lower electrode 31 of the electromechanical transducer element 30 is formed on the vibrating plate 20 via the adhesive layer 25. The electromechanical transducer film 32 is formed on a predetermined area of the lower electrode 31. Further, the upper electrode 33 is formed on the electromechanical transducer film 32.

A nozzle plate 50 including at least one nozzle 51 that ejects ink droplets is joined to a lower portion of the substrate 10. A pressure chamber 10x, which is in communication with the nozzle 51, is formed by the nozzle plate 50, the substrate 10, and the vibrating plate 20. The pressure chamber 10x may be referred to as an ink flow path, a pressurized liquid chamber, a compression chamber, an ejecting chamber, a liquid chamber, or the like. The vibrating plate 20 forms a part of the wall surface of the ink flow path. In other words, the pressure chamber 10x is sectioned by the substrate 10, which constitutes side surfaces, the nozzle plate 50, which constitutes a lower surface, and the vibrating plate 20, which constitutes an upper surface, and is in communication with the nozzle 51. It should be noted that descriptions of a liquid supplying unit, a flow path, and a fluid resistance are omitted in FIG. 15.

In order to produce the liquid ejecting head 1, for example, after the process illustrated in FIG. 7B of the first embodiment, the pressure chamber 10x is formed in the substrate 10 and the nozzle plate 50 is joined to the substrate 10. For example, the pressure chamber 10x can be formed by anisotropic etching. Note that the anisotropic etching uses characteristics in which an etching rate varies with respect to a plane direction of a crystal structure. For example, in anisotropic etching immersing the element in an alkali solution such as KOH, an etching rate of (111) face is about 1/400th of an etching rate of (100) face. Accordingly, a structure having about an inclination of 54 degrees can be formed in the face orientation of (100). On the other hand, a deep trench can be formed in the face orientation of (110). After forming the pressure chamber 10x, the nozzle plate 50, which includes the nozzle 51, is joined to the lower surface of the substrate 10, and the liquid ejecting head 1 is accomplished (produced).

Figure 16:
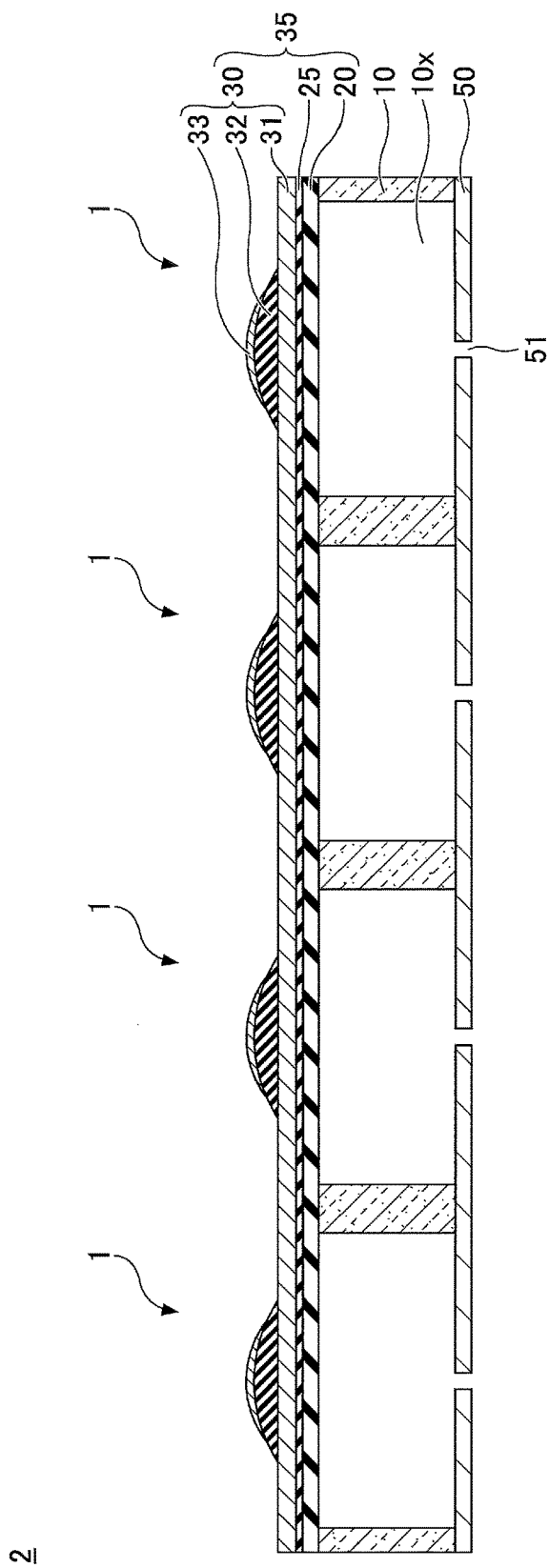
FIG. 16 is a cross-sectional view (part 2) illustrating the example of the liquid ejecting head according to the second embodiment.

Here, one liquid ejecting head 1 is illustrated in FIG. 15. However, in practice, a liquid ejecting head 2 in which a plurality of liquid ejecting heads 1 are arranged in a predetermined direction is produced as illustrated in FIG. 16. At this time, each electromechanical transducer film 32 may be arranged as illustrated in FIG. 8 or 9, for example.

The liquid ejecting head 2 includes an ejection driving unit 35, in which the plurality of electromechanical transducer elements 30 are arranged on the vibrating plate 20, the nozzles 51 that eject liquid, and the pressure chambers 10x in communication with the nozzles 51. The nozzles 51 and the pressure chambers 10x are provided corresponding to the respective electromechanical transducer elements 30. According to the liquid ejecting head 2, a part of the wall of the pressure chamber 10x is constituted with the vibrating plate 20. The ejection driving unit 35 increases a pressure of the liquid in each pressure chamber 10x. A plurality of ejection driving units 35 may be provided corresponding to the respective electromechanical transducer elements 30.

Third Embodiment

Figure 17:
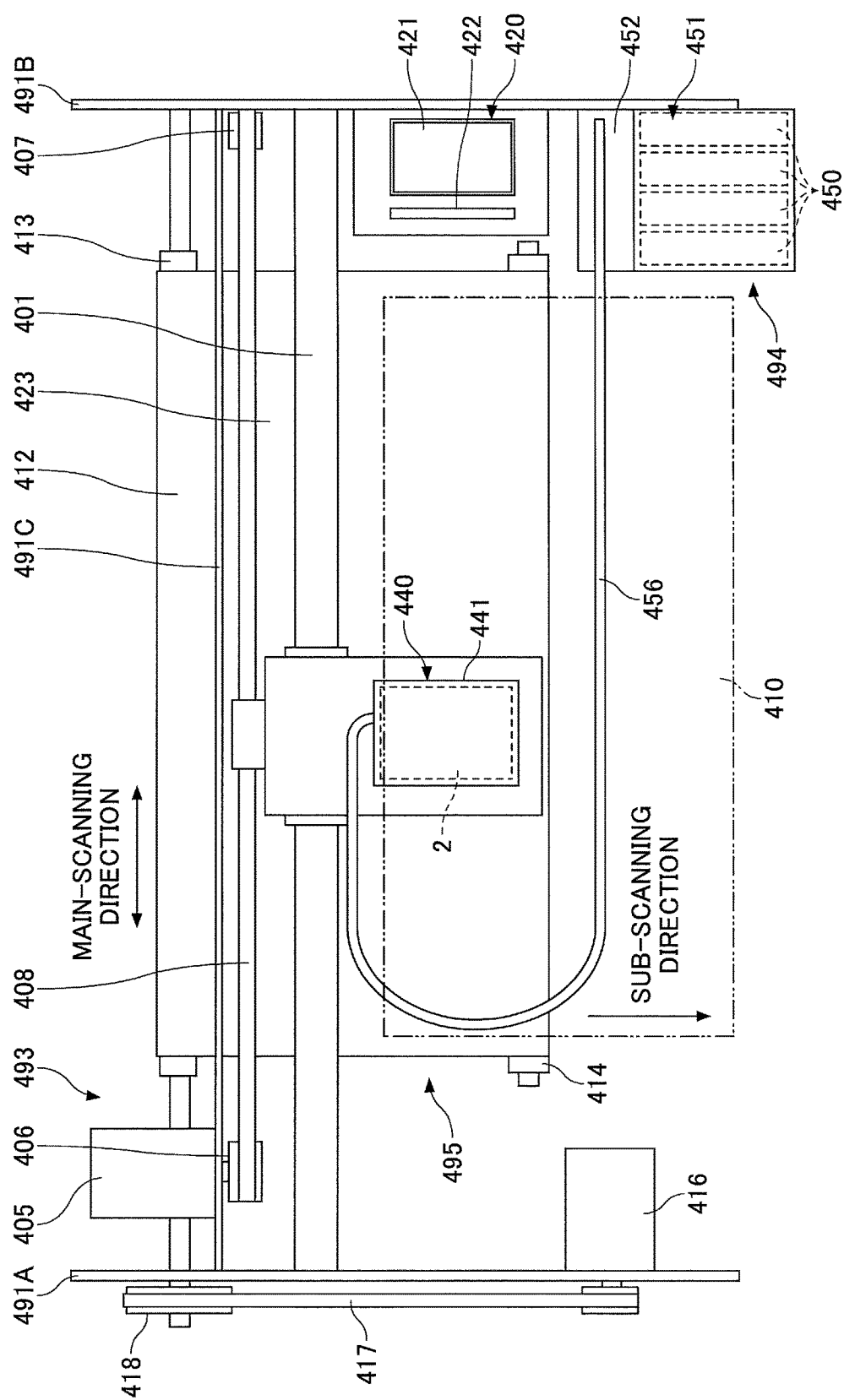
FIG. 17 is a plan view of an example of a relevant part of an apparatus for ejecting liquid according to a third embodiment.
Figure 18:
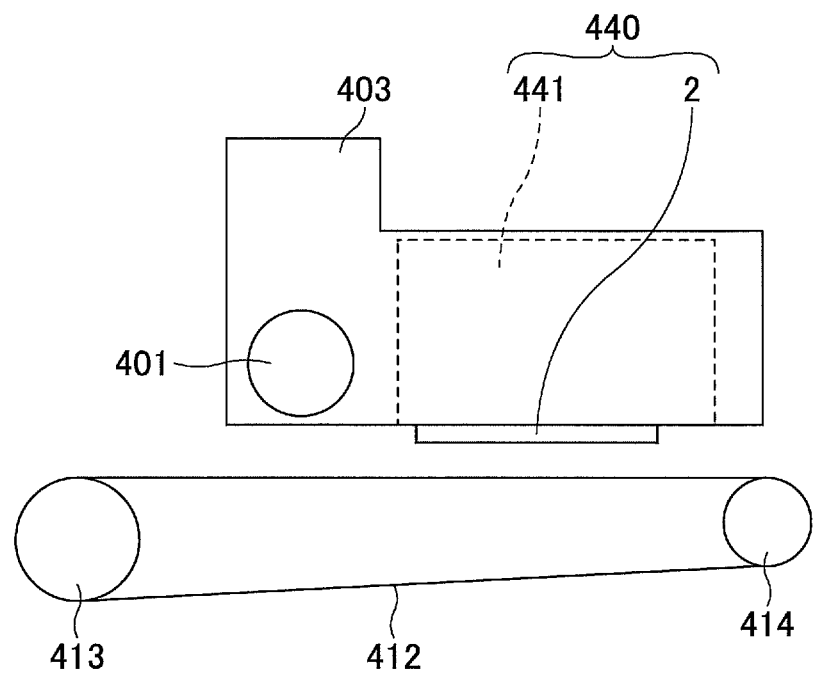
FIG. 18 is a side view of the example of the relevant part of the apparatus for ejecting liquid according to the third embodiment.

According to a third embodiment, an example of an apparatus for ejecting liquid, which includes the liquid ejecting head 2 illustrated in FIG. 16, will be described. In the following descriptions of the third embodiment, descriptions of elements same as the elements already described in the first or second embodiment may be omitted as appropriate. An example of an apparatus for ejecting liquid according to the third embodiment will be described with reference to FIGS. 17 and 18. FIG. 17 is a plan view of a relevant part of the apparatus for ejecting liquid. FIG. 18 is a side view of the relevant part of the apparatus for ejecting liquid.

The apparatus is a serial type apparatus. A carriage 403 is reciprocally moved by a main scanning moving mechanism 493 in a main scanning direction. The main scanning moving mechanism 493 includes a guide member 401, a main scanning motor 405, a timing belt 408, and the like. The guide member 401 is supported by a left side plate 491 and a right side plate 491B and holds the carriage 403 such that the carriage 403 is movable. The main scanning motor 405 reciprocates the carriage 403 in the main scanning direction via the timing belt 408 supported by a driving pulley 406 and a driven pulley 407.

A liquid ejecting unit 440, in which the liquid ejecting head 2 according to the second embodiment is integrated with a head tank 441, is mounted on the carriage 403. The liquid ejecting head 2 of the liquid ejecting unit 440 ejects liquid (liquid droplets) of respective colors of yellow (Y), cyan (C), magenta (M), and black (K), for example. Further, at least one nozzle row having a plurality of nozzles 51 is arranged on the liquid ejecting head 2. The plurality of nozzles 51 are arranged in a sub scanning direction perpendicular to the main scanning direction. The liquid is ejected downward from the nozzles 51.

A supplying mechanism 494 is a mechanism for supplying, to the liquid ejecting head 2, liquid stored outside the liquid ejecting head 2. The supplying mechanism 494 supplies, to the head tank 441, the liquid stored in liquid cartridges 450.

The supplying mechanism 494 may include a cartridge holder 451 (filling unit), on which the liquid cartridges 450 are mounted, a tube 456, a liquid feeding unit 452, which includes a liquid feeding pomp, and the like. The liquid cartridges 450 are detachably attached to the cartridge holder 451. The liquid is fed to the head tank 441 from the liquid cartridges 450 by the liquid feeding unit 452 via the tube 456.

The apparatus for ejecting liquid includes a conveying mechanism 495 for conveying a sheet 410. The conveying mechanism 495 includes a conveying belt 412, which is a conveying unit, and a sub-scanning motor 416 for driving the conveying belt 412.

The conveying belt 412 conveys the sheet 410 at a position facing the liquid ejecting head 2, while attracting the sheet 410. The conveying belt 412 is an endless belt and supported by a conveying roller 413 and a tension roller 414. The conveying belt 412 attracts the sheet 10 with electrostatic attraction, air suction, or the like.

The conveying roller 413 is rotated by the sub-scanning motor 416 via the timing belt 417 and the timing pulley 418 to circulate (rotate) the conveying belt 412 in the sub-scanning direction.

At one end side in the main scanning direction of the carriage 403, a maintenance recovery mechanism 420 is disposed near a lateral side of the conveying belt 412. The maintenance recovery mechanism 420 maintains and recovers the liquid ejecting head 2.

The maintenance recovery mechanism 420 includes, for example, a cap member 420, which caps nozzle faces (surfaces on which the nozzles 51 are formed) of the liquid ejecting head 2, a wiper member 422, which wipes the nozzle faces, and the like.

The main scanning moving mechanism 493, the supplying mechanism 494, the maintenance recovery mechanism 420, and the conveying mechanism 495 are attached to a housing, which includes the side plates 491A and 491B, and a back plate 491C.

According to the apparatus, which ejects ink, having a configuration as described above, the sheet 410 is fed to the conveying belt 412 and attracted by the conveying belt 412, and the sheet 410 is conveyed in the sub-scanning direction by the circular movement of the conveying belt 412.

The liquid ejecting head 2 is driven in response to an image signal while the carriage 403 is moved in the main scanning direction. Thereby, the liquid is ejected onto the stopping sheet 410 to form an image.

As described above, because the apparatus for ejecting liquid includes the liquid ejecting head according to the second embodiment, it is possible to stably form a high-quality image.

Figure 19:
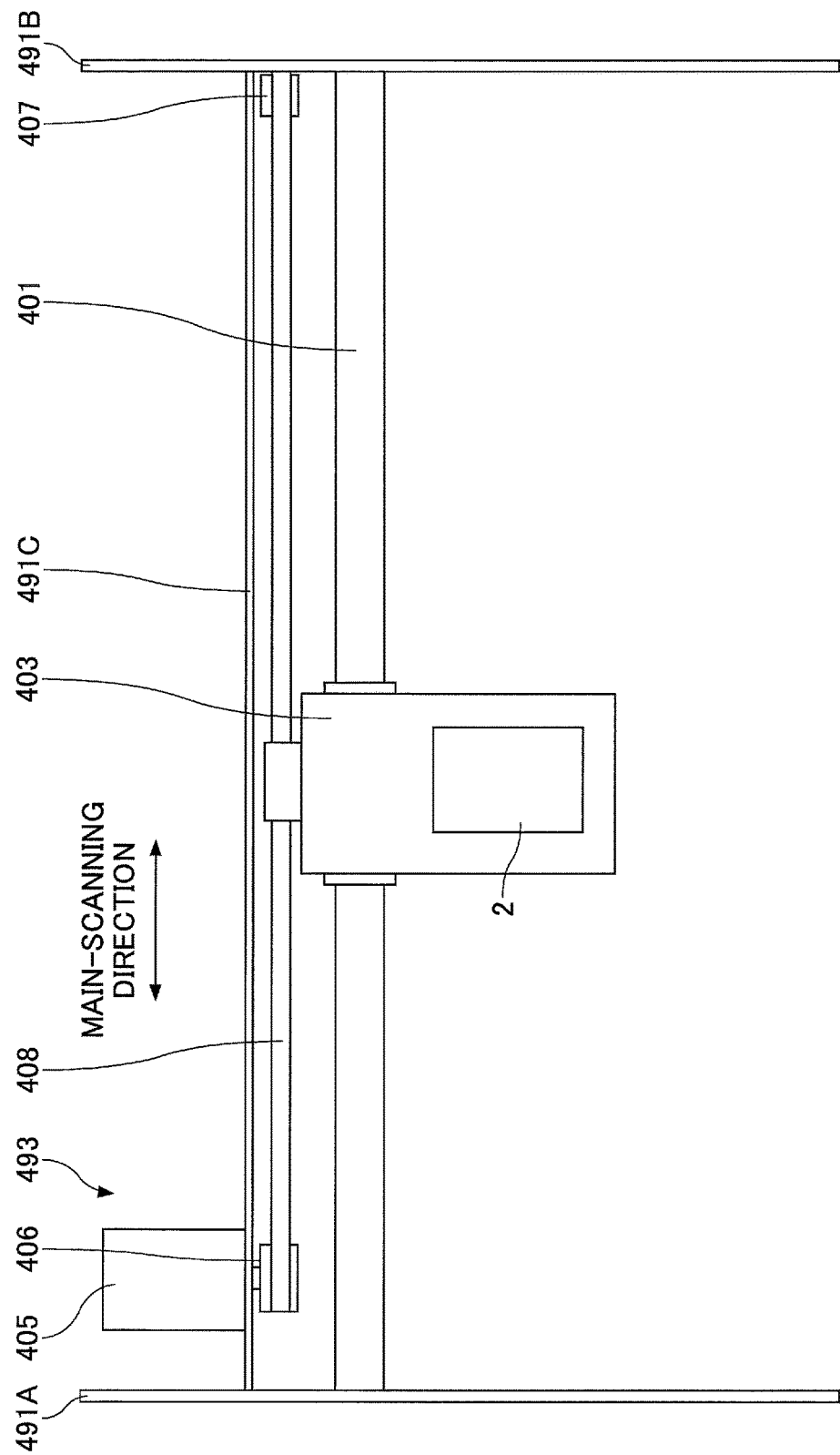
FIG. 19 is a plan view of another example of a relevant part of a liquid ejecting unit according to the third embodiment.

Another example of a liquid ejecting unit according to the third embodiment will be described with reference to FIG. 19. FIG. 19 is a plan view of a relevant part of the liquid ejecting unit.

Among the members that constitute the apparatus for ejecting liquid, the housing part, constituted with the side plates 491A and 491B and the back plate 491C, the main scanning moving mechanism 493, the carriage 403, and the liquid ejecting head 2 constitute the liquid ejecting unit.

Note that at least one of the previously described maintenance recovery mechanism 420 and the supplying mechanism 494 may be additionally attached to, for example, the side plate 491B of this liquid ejecting unit.

Figure 20:
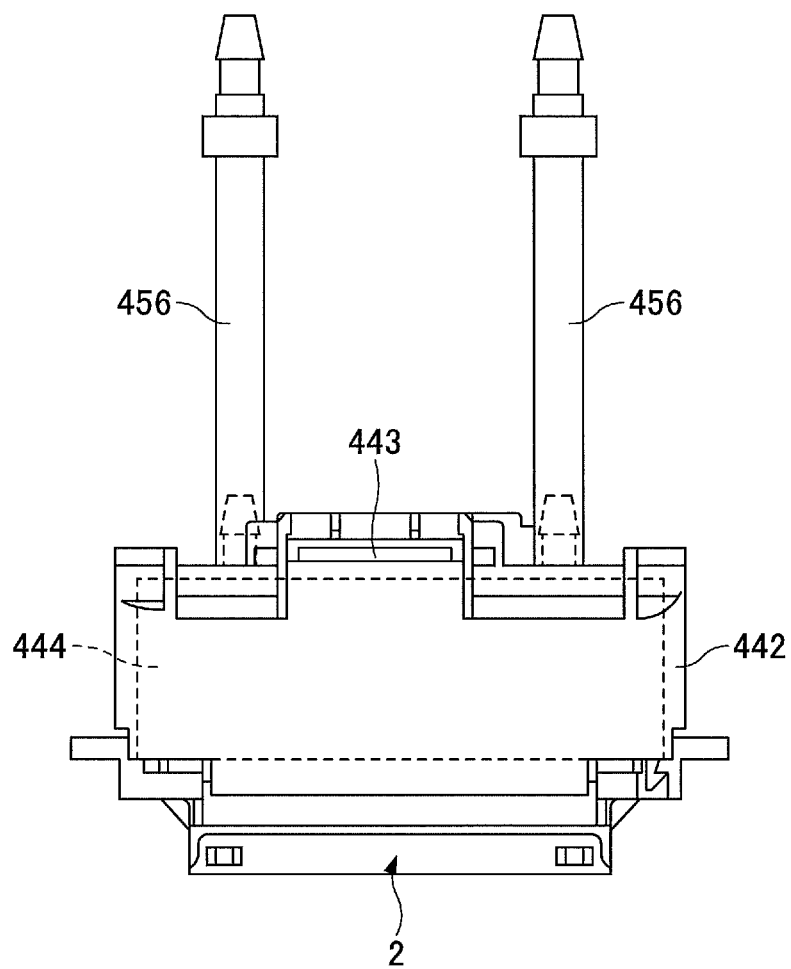
FIG. 20 is a plan view of another example of a relevant part of a liquid ejecting unit according to the third embodiment.

Another example of a liquid ejecting unit according to the third embodiment will be described with reference to FIG. 20. FIG. 20 is a front view of the liquid ejecting unit.

The liquid ejecting unit includes the liquid ejecting head 2, to which a passage component (flow path component) 444 is attached, and tubes 456 coupled to the passage component 444.

The passage component 444 is disposed inside of a cover 442. The head tank 441 may be included instead of the passage component 444. Further, a connector 443, which is electrically connected to the liquid ejecting head 2, is provided on an upper portion of the passage component 444.

In the present disclosure, "the apparatus for ejecting liquid" may be an apparatus, which includes a liquid ejecting head or a liquid ejecting unit, and drives the liquid ejecting head to eject liquid (liquid droplets). An apparatus, which is able to eject liquid on a medium (material) to which the liquid can adhere, may be used as the apparatus for ejecting liquid. Further, an apparatus, which ejects liquid to a gas or liquid fluid, may be the apparatus for ejecting liquid.

"The apparatus for ejecting liquid" may include at least one of a unit that feeds a medium (material) to which the liquid can adhere, a unit that conveys the medium, a unit that discharges the medium, a preprocessing apparatus and a post processing apparatus.

For example, "the apparatus for ejecting liquid" may be an image forming apparatus, which ejects ink to form an image on a sheet, or a solid modeling device (or a three-dimensional modeling device), which ejects modeling liquid to powder layers laminated with powder to perform solid modeling (or three-dimensional modeling).

Further, "the apparatus for ejecting liquid" is not limited to apparatuses that generate (visualize), by ejecting liquid (liquid droplets), meaningful images such as characters and figures. For example, an apparatus, which forms meaningless images such as patterns, or an apparatus, which models three dimensional images, may be used as the apparatus for ejecting liquid. The above described "medium to which liquid can adhere" means a medium (or material) to which liquid can adhere even temporarily, a medium to which liquid adheres and is fixed, or a medium to which liquid adheres and permeates. For example, the "medium to which liquid can adhere" may be a medium to be recorded such as a sheet, paper, a recording medium, recording paper, a film, or a cloth, an electronic component such as an electronic substrate or a piezoelectric element, or a medium such as a powder layer, an organ model, or a cell for inspection. Unless specified in particular, the medium to which liquid can adhere may include everything to which liquid adheres.

The material of the above described "medium to which liquid can adhere" may be paper, yarn, fiber, leather, metal, plastics, glass, wood, or ceramics, to which liquid can adhere at least temporarily.

The "liquid" may be ink, processing liquid, DNA samples, resists, pattern materials, binding agents, modeling liquid, amino acid, protein, calcium-contained solutions, dispersion liquid, or the like.

Further, "the apparatus for ejecting liquid" may be an apparatus, in which the liquid ejecting head and the medium, to which liquid can adhere, move relative to each other. However, the apparatus for ejecting liquid is not limited to this apparatus. For example, the apparatus for ejecting liquid may be a serial type apparatus, which moves the liquid ejecting head, a line type apparatus, which does not move the liquid ejecting head, or the like.

Further, "the apparatus for ejecting liquid" may be a processing liquid applying apparatus, which ejects processing liquid to a surface of a sheet to apply the processing liquid to the surface of the sheet for improving (reforming) the surface of the sheet, an injecting granulation apparatus, which ejects composition liquid containing a raw material dispersed in a solution via a nozzle and granulates the raw material into particles, or the like.

"The liquid ejecting unit" may be a unit, in which functional components and mechanisms are integrated with the liquid ejecting head, and may be an assembly of component parts related to liquid ejection. For example, "the liquid ejecting unit" may be a unit, in which at least one of the head tank, the carriage, the supplying mechanism, the maintenance recovery mechanism, and the main scanning moving mechanism is combined (integrated) with the liquid ejecting head.

For example, a unit, in which the liquid ejecting head and the functional components and mechanisms are fixed to each other with fastening, adhesion, engagement, or the like, may be used. A unit, in which one of the liquid ejecting head and the functional components and mechanisms may be held movably with respect to the other, may be used. Further, one of the liquid ejecting head and the functional components and mechanisms may be detachably attached to the other.

For example, similar to the liquid ejecting unit 440 illustrated in FIG. 18, a unit, in which the liquid ejecting head is integrated with the head tank, may be used as the liquid ejecting unit. Further, a unit, in which a tube or the like is used to connect and integrate the liquid ejecting head and the head tank, may be used. Here, the liquid ejecting unit may further include a unit including a filter between the head tank and the liquid ejecting head.

Further, a unit, in which the liquid ejecting head is integrated with the carriage, may be used as the liquid ejecting unit.

Further, a unit, in which the guide member constituting a part of the scanning moving mechanism movably holds the liquid ejecting head to integrate the liquid ejecting head and the scanning moving mechanism, may be used as the liquid ejecting unit. Further, as illustrated in FIG. 19, a unit, in which the liquid ejecting head is integrated with the carriage and the main scanning moving mechanism, may be used as the liquid ejecting unit.

Further, a unit in which the cap member, which is the part of the maintenance recovery mechanism, is fixed to the carriage, to which the liquid ejecting head is attached, to integrate the liquid ejecting head, the carriage, and the maintenance recovery mechanism may be used as the liquid ejecting unit.

Further, as illustrated in FIG. 20, a unit in which the tubes are coupled to the head tank or the liquid ejecting head, to which the passage component is attached, to integrate the liquid ejecting head and the supplying mechanism may be used as the liquid ejecting unit.

The main scanning moving mechanism may be the guide member itself. The supplying mechanism may be the tube itself, or the cartridge holder itself.

A pressure generation unit used for "the liquid ejecting head" is not limited. For example, other than a piezoelectric actuator (laminated piezoelectric elements may be used) as described in above embodiments, a thermal actuator using an electric heat transducer element such as a heat resistance element, or an electrostatic actuator including a vibration plate and a counter electrode may be used.

Further, in this disclosure, the terms image formation, recording, printing, image recording, image printing, molding, shaping and the like are used as synonyms for one another.

Further, the present disclosure is not limited to these embodiments, but various variations and modifications may be made without departing from the scope of the present disclosure.

For example, the upper electrode is used as an individual electrode and the lower electrode is used as a common electrode in the above described embodiments, the present disclosure is not limited to this. That is, the same advantageous effect may also be obtained from a configuration, in which the upper electrode is used as the common electrode and the lower electrode is used as the individual electrode.

The liquid ejecting head including the electromechanical transducer element according to the present disclosure may be applied to a micropump, an ultrasonic motor, an acceleration sensor, a dual-axis scanner for projector, an infusion pump, or the like.

The order of the method of the present disclosure is not limited to the order of processes of the method disclosed in the above described embodiments.

What is claimed is:

1. An electromechanical transducer element comprising:
a first electrode;
an electromechanical transducer film stacked on one surface of the first electrode;
a second electrode stacked on the electromechanical transducer film; and
wiring formed on the second electrode,
wherein, in an at least one cross section, each of a boundary, on a second electrode side, of the electromechanical transducer film and a boundary, on a side opposite to the electromechanical transducer film, of the second electrode is a curved shape protruding away from the first electrode,
wherein, in the at least one cross section, each of a film thickness of the electromechanical transducer film and a film thickness of the second electrode becomes thinner toward end portions from a maximum height portion,
wherein, in the cross section, the boundary, on the second electrode side, of the electromechanical transducer film is approximated by a formula 1: $y=-ax^2+b$ where a and b are constants,
wherein, in the cross section, the boundary, on the side opposite to the electromechanical transducer film, of the second electrode is approximated by a formula 2: $y=-cx^2+d$ where c and d are constants,
wherein, in the formula 1 and the formula 2, x represents a coordinate position in a direction perpendicular to a film thickness direction, when a center of a width Wp of the electromechanical transducer film in the cross section is defined as x=0,
wherein, in the formula 1, y, which is a function of x, represents a height from an end portion of the electromechanical transducer film, and
wherein, in the formula 2, y, which is a function of x, represents a height from an end portion of the second electrode in the cross section.

2. The electromechanical transducer element according to claim 1,
wherein, in the formula 1, the a satisfies a relationship of $0.8\times\{(4Tp)/Wp^2\}<a<1.2\times\{(4Tp)/Wp^2\}$ where Tp represents a maximum height of the electromechanical transducer film from the end portion of the electromechanical transducer film in the cross section, and wherein, in the formula 2, the c satisfies a relationship of $0.8 \times \{(4Te)/We^2\} < c < 1.2 \times \{(4Te)/We^2\}$ where We represents a width of the second electrode in the cross section and Te represents a maximum height of the second electrode from the end portion of the second electrode in the cross section.

3. The electromechanical transducer element according to claim 1, wherein, in the formula 1, the b satisfies a relationship of $0.8Tp < b < 1.2Tp$ where Tp represents a maximum height of the electromechanical transducer film from the end portion of the electromechanical transducer film in the cross section, and wherein, in the formula 2, the d satisfies a relationship of $0.8\{Tm-(4Tp^2/We^2) \times We^2 + Tp\} < d < 1.2\{Tm-(4Tp^2/We^2) \times We^2 + Tp\}$ where We represents a width of the second electrode in the cross section and Tm represents a maximum height of the second electrode from the end portion of the electromechanical transducer film in the cross section.

4. The electromechanical transducer element according to claim 1, a maximum height Tp of the electromechanical transducer film from the end portion of the electromechanical transducer film in the cross section is greater than or equal to 5 μm.

5. The electromechanical transducer element according to claim 1, the width Wp is greater than or equal to 20 μm and less than or equal to 500 μm.

6. The electromechanical transducer element according to claim 1, wherein the second electrode is formed on an area except for an outer peripheral portion of the electromechanical transducer film.

7. A liquid ejecting head comprising:
a nozzle configured to eject liquid;
a pressure chamber in communication with the nozzle; and
an ejection driving unit configured to increase a pressure of the liquid in the pressure chamber,
wherein the ejection driving unit includes a vibrating plate constituting a part of a wall of the pressure chamber and the electromechanical transducer element according to claim 1 formed on the vibrating plate.

8. A liquid ejecting unit comprising:
the liquid ejecting head according to claim 7.

9. The liquid ejecting unit according to claim 8, wherein at least one of a head tank, configured to store the liquid to be supplied to the liquid ejecting head, a carriage, on which the liquid ejecting head is mounted, a supplying mechanism, configured to supply the liquid to the liquid ejecting head, a maintenance recovery mechanism, configured to maintain and recover the liquid ejecting head, and a main scanning moving mechanism configured to move the liquid ejecting head in a main scanning direction is integrated with the liquid ejecting head.

10. An apparatus for ejecting liquid, the apparatus comprising the liquid ejecting head according to claim 7.

11. A method for producing an electromechanical transducer element, the electromechanical transducer element including a first electrode; an electromechanical transducer film stacked on one surface of the first electrode; a second electrode stacked on the electromechanical transducer film; and wiring formed on the second electrode, the method comprising:

crystallizing, by repeating a process of applying first liquid to the surface of the first electrode by an ink jet method to form a first application film and a process of heating the first application film, the first application film to form the electromechanical transducer film;

applying second liquid to one surface of the electromechanical transducer film by the ink jet method to form a second application film; and heating the second application film to form the second electrode;

wherein, in an at least one cross section, each of a boundary, on a second electrode side, of the electromechanical transducer film and a boundary, on a side opposite to the electromechanical transducer film, of the second electrode is a curved shape protruding away from the first electrode, and wherein, in the at least one cross section, each of a film thickness of the electromechanical transducer film and a film thickness of the second electrode becomes thinner toward end portions from a maximum height portion, wherein, in the cross section, the boundary, on the second electrode side, of the electromechanical transducer film is approximated by a formula 1: $y=-ax^2+b$ where a and b are constants, wherein, in the cross section, the boundary, on the side opposite to the electromechanical transducer film, of the second electrode is approximated by a formula 2: $y=-cx+d$ where c and d are constants, wherein, in the formula 1 and the formula 2, x represents a coordinate position in a direction perpendicular to a film thickness direction, when a center of a width Wp of the electromechanical transducer film in the cross section is defined as x=0, wherein, in the formula 1, y, which is a function of x, represents a height from an end portion of the electromechanical transducer film, and wherein, in the formula 2, y, which is a function of x, represents a height from an end portion of the second electrode in the cross section.

12. The method according to claim 11, wherein the second application film is formed on an area except for an outer peripheral portion of the surface of the electromechanical transducer film.

13. The method according to claim 12, further comprising;
forming a self-assembled monolayer film on the surface of the electromechanical transducer film before forming the second application film; and
causing the self-assembled monolayer film to remain in the outer peripheral portion of the surface of the electromechanical transducer film and removing the self-assembled monolayer film of an area except for the outer peripheral portion of the surface of the electromechanical transducer film.

* * * * *